US010068902B1

(12) United States Patent
Shen et al.

(10) Patent No.: US 10,068,902 B1
(45) Date of Patent: Sep. 4, 2018

(54) INTEGRATED CIRCUIT STRUCTURE INCORPORATING NON-PLANAR FIELD EFFECT TRANSISTORS WITH DIFFERENT CHANNEL REGION HEIGHTS AND METHOD

(71) Applicant: GLOBALFOUNDRIES INC., Grand Cayman (KY)

(72) Inventors: Yanping Shen, Saratoga Springs, NY (US); Hui Zang, Guilderland, NY (US); Hsien-Ching Lo, Clifton Park, NY (US); Yongjun Shi, Clifton Park, NY (US); Randy W. Mann, Milton, NY (US); Yi Qi, Niskayuna, NY (US); Guowei Xu, Ballston Lake, NY (US); Wei Hong, Clifton Park, NY (US); Jerome Ciavatti, Mechanicville, NY (US); Jae Gon Lee, Waterford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/715,220

(22) Filed: Sep. 26, 2017

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823431* (2013.01); *H01L 21/823481* (2013.01);
(Continued)

(58) Field of Classification Search
CPC ......... H01L 27/0886; H01L 21/823481; H01L 29/66545; H01L 27/1104;
(Continued)

(56) References Cited

U.S. PATENT DOCUMENTS 6,909,147 B2   6/2005 Aller et al.
7,544,994 B2   6/2009 Schepis et al.
(Continued)

OTHER PUBLICATIONS

De Bisschop et al., "Joint-Optimization of Layout and Litho for SRAM and Logic Towards the 20 nm Node, Using 193i", Proceedings of SPIE, vol. 7973, 2011, pp. 1-18.

Primary Examiner — Marc Armand
Assistant Examiner — Sue Tang
(74) *Attorney, Agent, or Firm* — Gibb & Riley, LLC; Francois Pagette

(57) ABSTRACT

Disclosed is a method of forming an integrated circuit (IC) structure with multiple non-planar transistors having different effective channel widths. In the method, sacrificial gates are removed from partially completed transistors, creating gate openings that expose sections of semiconductor fins between source/drain regions. Prior to forming replacement metal gates in the gate openings, additional process steps are performed so that, in the resulting IC structure, some transistors have different channel region heights and, thereby different effective channel widths, than others. These steps can include forming isolation regions in the bottoms of some gate openings. Additionally or alternatively, these steps can include filling some gate openings with a sacrificial material, recessing the sacrificial material to expose fin tops within those gate openings, either recessing the fin tops or forming isolation regions in the fin tops, and removing the sacrificial material. Also disclosed is an IC structure formed according to the method.

4 Claims, 29 Drawing Sheets

(51) Int. Cl.
*H01L 27/11* (2006.01)
*H01L 29/06* (2006.01)
*H01L 29/66* (2006.01)

(52) U.S. Cl.
CPC ...... *H01L 27/1104* (2013.01); *H01L 29/0649* (2013.01); *H01L 29/66545* (2013.01)

(58) Field of Classification Search
CPC ......... H01L 21/823431; H01L 29/0649; H01L 21/845; H01L 27/0924
USPC ....................................................... 257/401
See application file for complete search history.

(56) References Cited

U.S. PATENT DOCUMENTS

| | | |
|---|---|---|
| 7,547,947 B2 | 6/2009 | Anderson et al. |
| 8,765,533 B2 | 7/2014 | Hsieh et al. |
| 8,766,363 B2 | 7/2014 | Cheng et al. |
| 8,941,153 B2 | 1/2015 | Lee et al. |
| 9,000,537 B2 | 4/2015 | Cai et al. |
| 9,105,723 B2 | 8/2015 | Cheng et al. |
| 9,159,576 B2 | 10/2015 | Song |
| 9,196,541 B2 | 11/2015 | Zhu et al. |
| 9,472,558 B1 | 10/2016 | Cheng et al. |
| 9,502,408 B2 | 11/2016 | Kerber et al. |
| 9,559,011 B2 | 1/2017 | Chiang et al. |
| 2008/0128796 A1 | 6/2008 | Zhu et al. |
| 2008/0157225 A1 | 7/2008 | Datta et al. |
| 2009/0250769 A1 | 10/2009 | Yu et al. |
| 2009/0321834 A1 | 12/2009 | Rachmady et al. |
| 2012/0299110 A1 | 11/2012 | Hung et al. |
| 2014/0106528 A1 | 4/2014 | Quyang et al. |
| 2015/0279999 A1* | 10/2015 | Xie .................... H01L 21/0217 257/401 |
| 2015/0380257 A1 | 12/2015 | Song |
| 2016/0247728 A1* | 8/2016 | You .................. H01L 21/82382 |
| 2016/0268400 A1 | 9/2016 | Akarvardar et al. |
| 2016/0359020 A1* | 12/2016 | Choi ................. H01L 29/66795 |

* cited by examiner

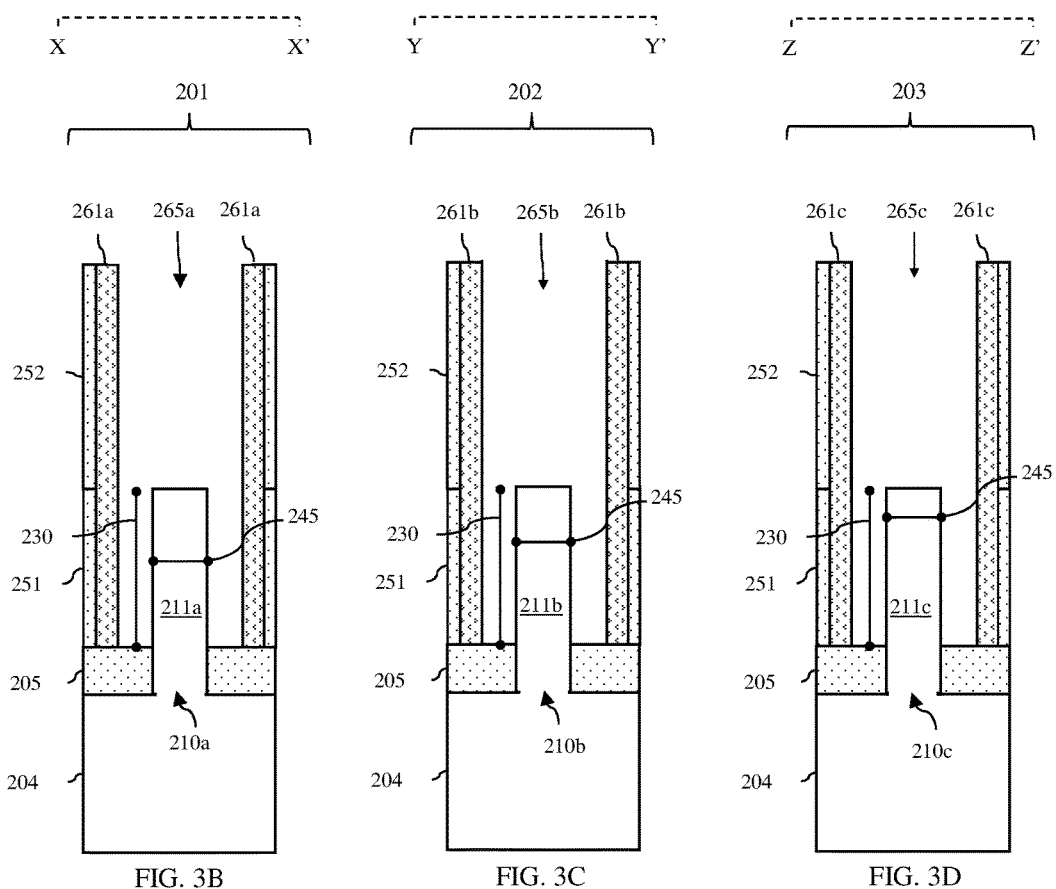

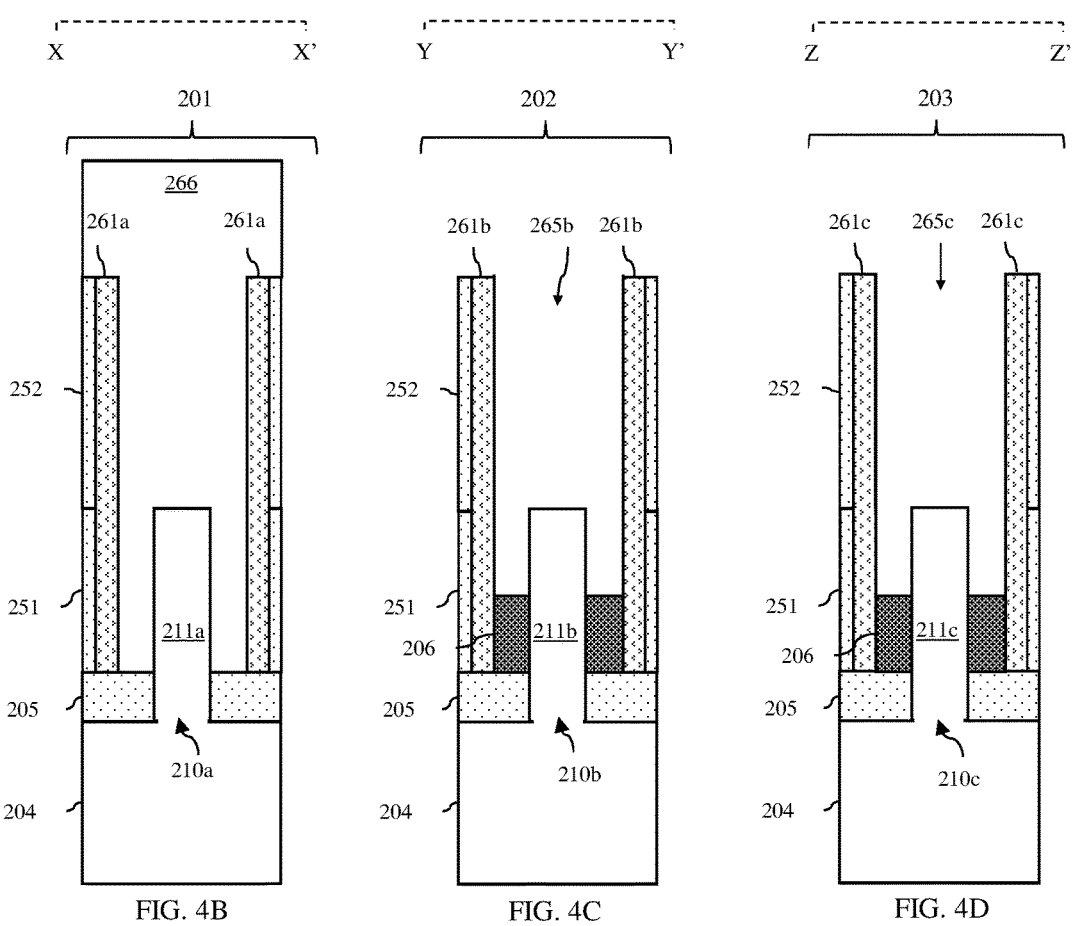

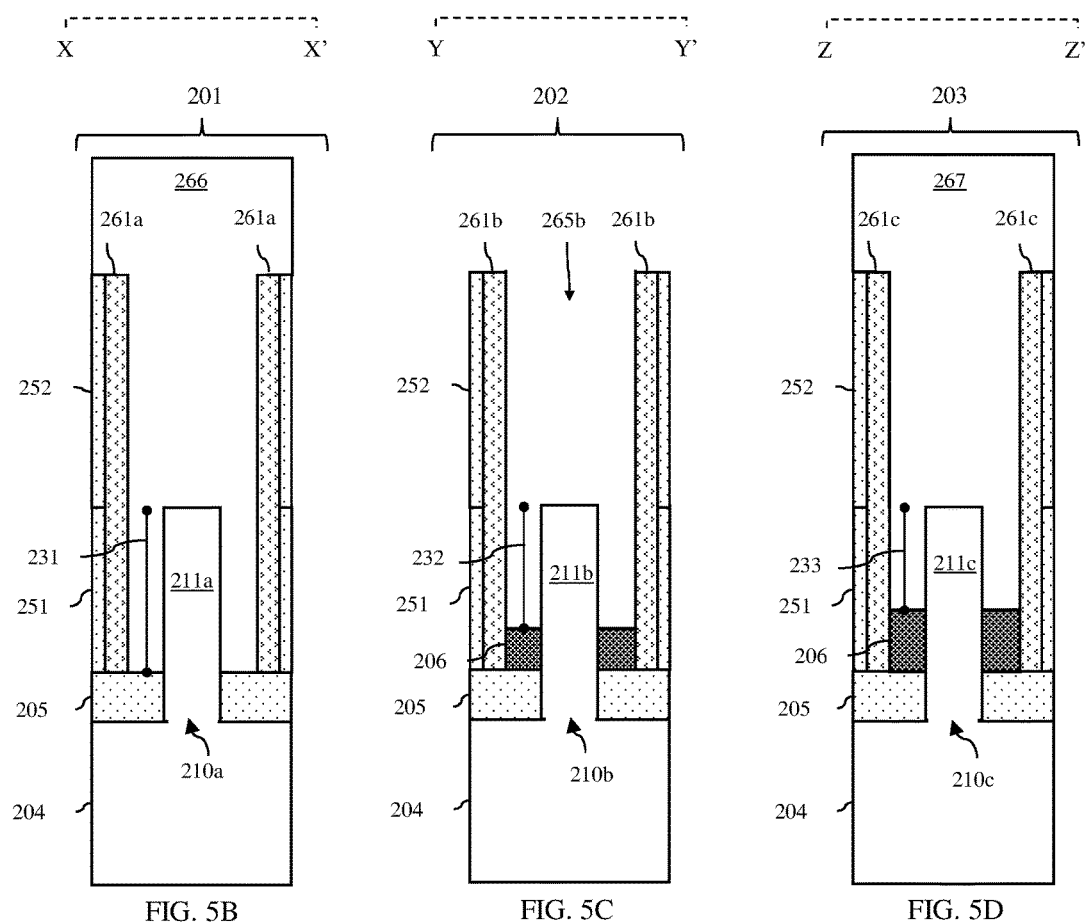

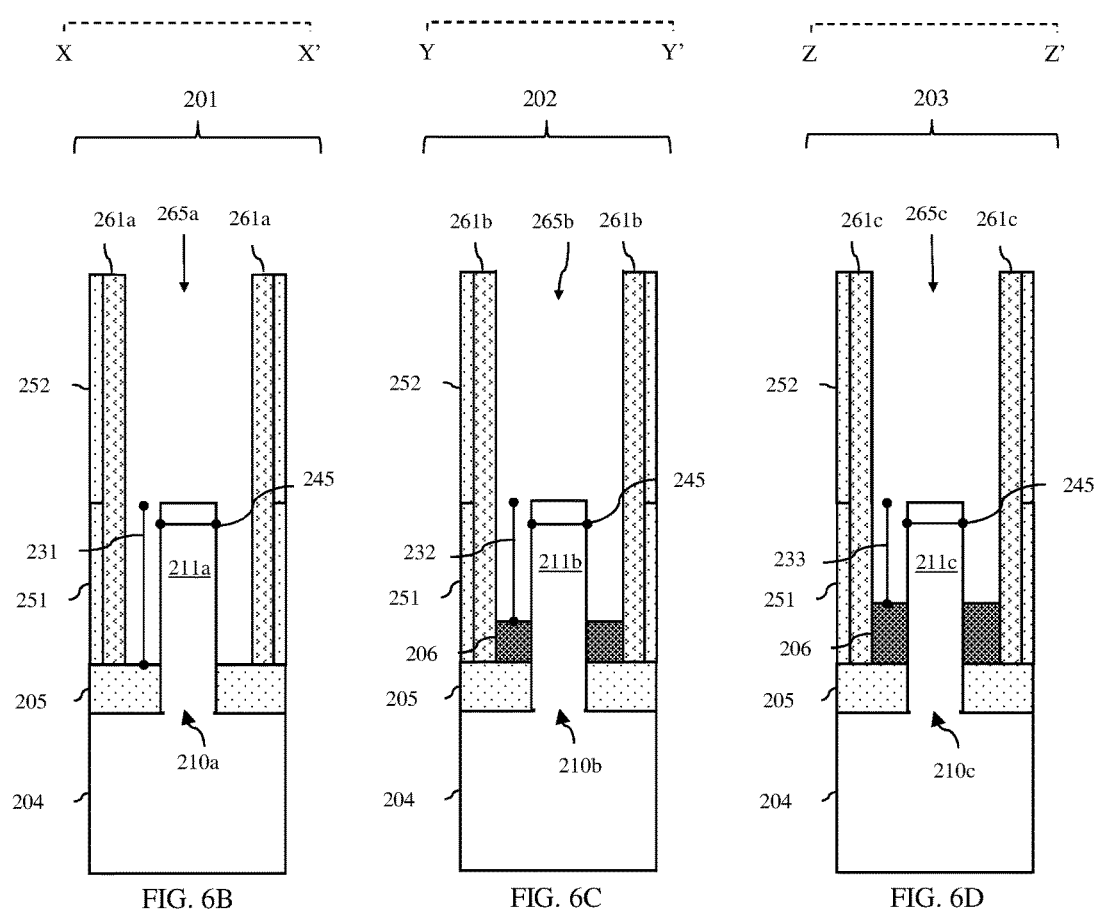

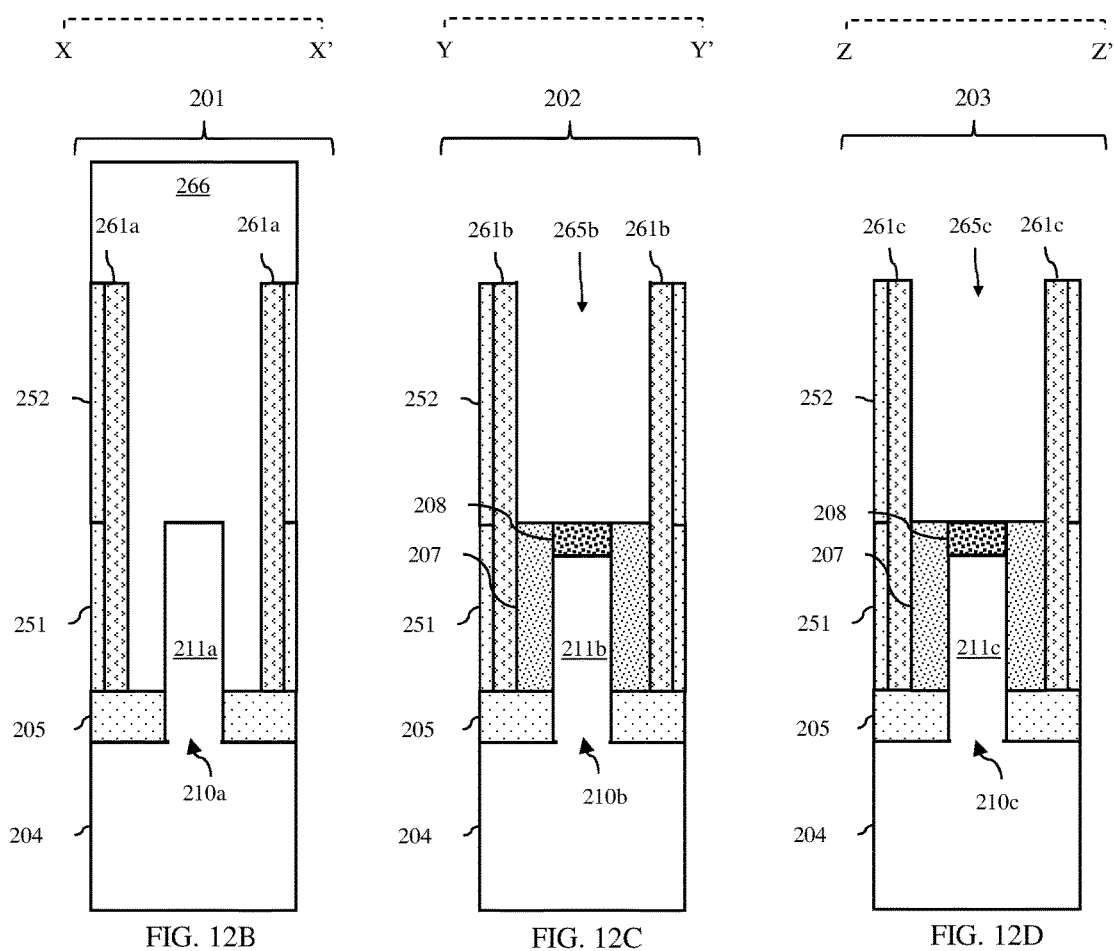

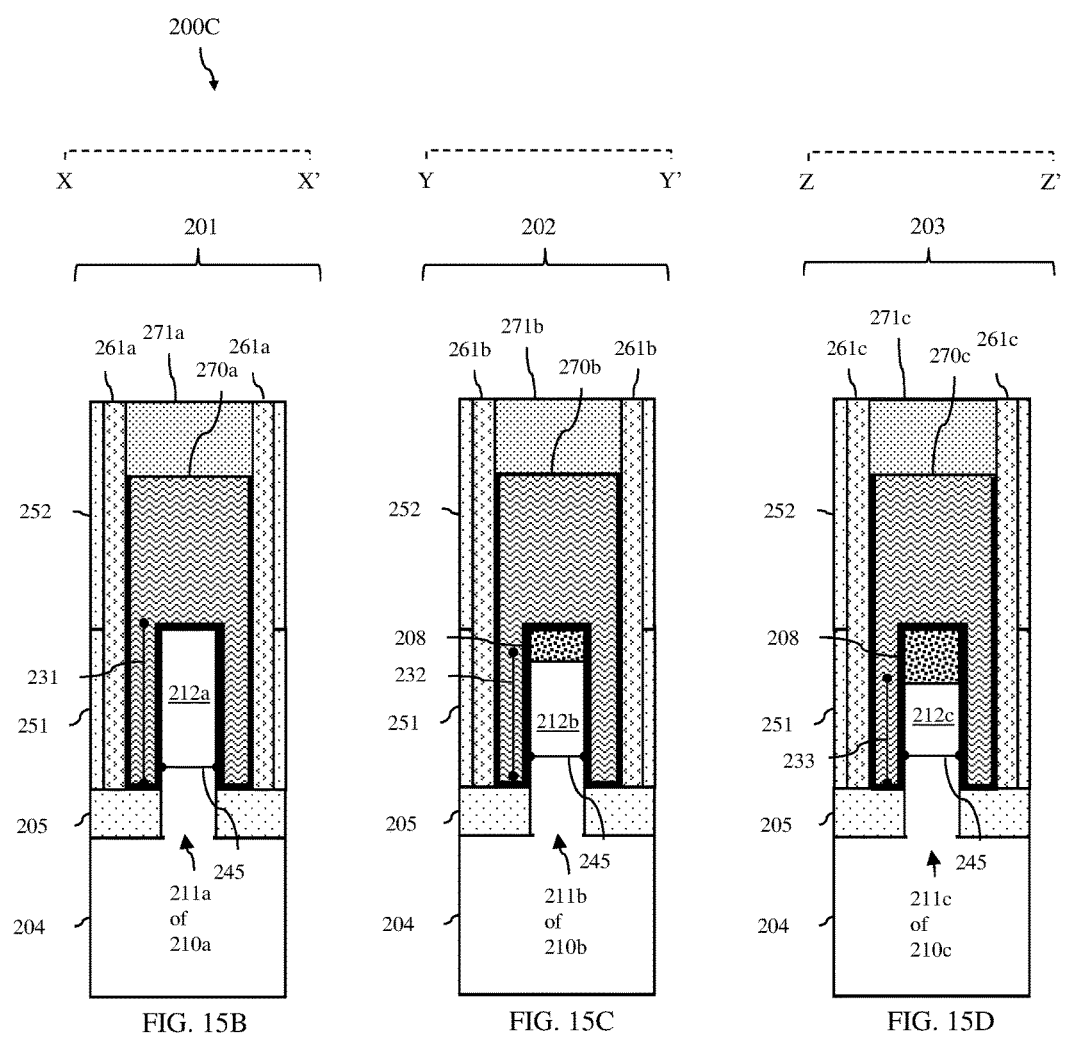

ND% INTEGRATED CIRCUIT STRUCTURE INCORPORATING NON-PLANAR FIELD EFFECT TRANSISTORS WITH DIFFERENT CHANNEL REGION HEIGHTS AND METHOD

BACKGROUND

Field of the Invention

The present invention relates to integrated circuit (IC) structures and, more particularly, to an IC structure that incorporates multi-gate non-planar field effect transistors with different channel region heights and a method of forming the structure.

Description of Related Art

Integrated circuit (IC) structures often incorporate multiple field effect transistors (FETs). For optimal circuit performance, some of the FETs may require a higher drive current and, thus, a different structure than others. For example, the FETs with the higher drive current will have a larger effective channel width than the FETs with the lower driver current. In non-planar multi-gate FETs (MUGFETs), such as dual-gate FETs (also referred to herein as fin-type FETs (FINFETs)) or tri-gate FETs, the different effective channel widths are often achieved by incorporating different numbers of semiconductor fins within different FETs and/or by incorporating semiconductor fins having different heights within the different FETs. Unfortunately, the use of multiple semiconductor fins increases the required chip area (i.e., increases circuit size) and the use of semiconductor fins with different heights can impact down-stream processing and cause other performance variations.

SUMMARY

In view of the foregoing, disclosed herein are embodiments of a method of forming an integrated circuit (IC) structure that incorporates non-planar multi-gate field effect transistors (MUGFETs) having different effective channel widths. In the embodiments, sacrificial gates are selectively removed from partially completed MUGFETs to create gate openings that expose sections of semiconductor fins between source/drain regions and, prior to forming replacement metal gates in the gate openings, additional process steps are performed in order to ensure that, in the resulting IC structure, some MUGFETs have different channel region heights and, thereby different effective channel widths and different drive currents than others. The additional processing steps can include, for example, forming isolation regions in the bottoms of some gate openings. Additionally or alternatively, the additional processing steps can include filling some gate openings with a protective sacrificial material, recessing the protective sacrificial material to expose fin tops within those gate openings, either recessing the fin tops or forming isolation regions in the fin tops, and removing the protective sacrificial material. Also disclosed herein are embodiments of an IC structure formed according to the above-described method embodiments.

More particularly, each of the embodiments of the disclosed method of forming an integrated circuit (IC) structure can include initiating non-planar multi-gate field effect transistor (MUGFET) processing so as to form partially completed transistors, including at least a partially completed first transistor and a partially completed second transistor, above an isolation layer, which is on a substrate and which has an essentially uniform thickness. The partially completed first transistor can have the following components: a first semiconductor fin including first source/drain regions and, positioned laterally between the first source/drain regions, a first section within which a first channel region will be created; a first sacrificial gate, having a first sacrificial gate cap and a first gate sidewall spacer, adjacent to a first top surface and first opposing sidewalls of the first section; first metal plugs on the first source/drain regions; and first plug caps on the first metal plugs. The partially completed second transistor can similarly have the following components: a second semiconductor fin including second source/drain regions and, positioned laterally between the second source/drain regions, a second section within which a second channel region will be created; a second sacrificial gate, having a second sacrificial gate cap and a second gate sidewall spacer, adjacent to a second top surface and second opposing sidewalls of the second section; second metal plugs on the second source/drain regions; and second plug caps on the second metal plugs. At this point in the processing, the first top surface of the first section of the first semiconductor fin and the second top surface of the second section of the second semiconductor fin will be essentially co-planar (i.e., at a same level) and the widths of these sections will be the same. The sacrificial gates of the partially completed transistors can then be selectively removed to form corresponding gate openings. Specifically, the first sacrificial gate can be selectively removed to form a first gate opening and the second sacrificial gate can be selectively removed to form a second gate opening. Thus, the first top surface and first opposing sidewalls of the first section of the first semiconductor fin will be exposed in the first gate opening and the second top surface and second opposing sidewalls of the second section of the second semiconductor fin will be exposed in the second gate opening. In the different embodiments of the method, prior to forming gates (e.g., replacement metal gates (RMGs)) in the gate openings, additional process steps can be performed in order to ensure that, in the resulting IC structure, some MUGFETs have different channel region heights and, thereby different effective channel widths and different drive currents than others.

For example, in one embodiment, a mask can be formed over the first gate opening, leaving the second gate opening unmasked. Then, an isolation region can be formed in the second gate opening above the isolation layer and positioned laterally adjacent to lower portions of the second opposing sidewalls. The mask can then be removed and gates (e.g., replacement metal gates (RMGs)) for the transistors can be formed in the gate openings. Specifically, a first gate for the first transistor can be formed in the first gate opening so that it is above and immediately adjacent to the isolation layer, so that it is adjacent to the first top surface and the first opposing sidewalls of the first section of the first semiconductor fin, and so that it defines a first channel region within that first section. Additionally, a second gate for the second transistor can be formed within the second gate opening so that it is above and immediately adjacent to the isolation region, so that it is adjacent to the second top surface and second opposing sidewalls of the second section of the second semiconductor fin, and so that it defines a second channel region in that second section. Due to the presence of the isolation region in the second gate opening and further due to the fact that the first top surface of the first section of the first semiconductor fin and the second top surface of the second section of the second semiconductor fin are co-planar, the gate-to-semiconductor interface length at each sidewall of the first semiconductor fin is greater than the gate-to-semiconductor interface length at each sidewall of the second semiconductor fin. Thus, the first channel region of the first transistor has a first height and the second channel region of the second transistor has a second height that is less than the first height.

In other embodiments, a mask can be formed over the first gate opening, leaving the second gate opening unmasked. A protective sacrificial material can be deposited so as to fill the second gate opening and to expose the second top surface of the second section, leaving the second opposing sidewalls protected. Then, the second top surface of the second section can be processed so as to ensure that in the resulting IC structure the first channel region will have a first height and the second channel region will have a second height that is less than the first height. For example, the second top surface of the second section of the second semiconductor fin can be recessed or an isolation region can be formed within the second section of the second semiconductor fin adjacent to the second top surface. During this processing, the protective sacrificial material ensures that the second opposing sidewalls of the second section of the second semiconductor fin are protected and, thus, ensures that the widths of the first section of the first semiconductor fin and the second section of the second semiconductor fin remain equal. Following this processing, the protective sacrificial material can be selectively removed and gates (e.g., replacement metal gates (RMGs)) for the transistors can be formed in the gate openings. Specifically, a first gate for the first transistor can be formed in the first gate opening so that it is above and immediately adjacent to the isolation layer, so that it is adjacent to the first top surface and the first opposing sidewalls of the first section of the first semiconductor fin, and so that it defines a first channel region within that first section. Additionally, a second gate for the second transistor can be formed in the second gate opening so that it is also above and immediately adjacent to the isolation layer, so that it is adjacent to the second top surface and second opposing sidewalls of the second section of the second semiconductor fin, and so that it defines a second channel region in that second section. Due to either the recessing of the second top surface of the second section of the second semiconductor fin or the presence of the isolation region in the second section of the second semiconductor fin adjacent to the second top surface, the gate-to-semiconductor interface length on at each sidewall of the first semiconductor fin is be greater than the gate-to-semiconductor interface length at each sidewall of the second semiconductor fin. Thus, the first channel region of the first transistor has a first height and the second channel region of the second transistor has a second height that is less than the first height.

Also disclosed herein are embodiments of an integrated circuit (IC) structure formed according to the above-described method embodiments. This IC structure can include a substrate and, on the substrate, an isolation layer that has an essentially uniform thickness. The IC structure can further include multiple non-planar multi-gate field effect transistors (MUGFETs) above the isolation layer. These MUGFETs can include at least a first transistor and a second transistor. The first transistor can include: a first channel region, which is within a first section of a first semiconductor fin and positioned laterally between first source/drain region, and a first gate (e.g., a first replacement metal gate (RMG)), having a first gate cap and a first gate sidewall spacer, adjacent to a first top surface and first opposing sidewalls of the first section of the first semiconductor fin at the first channel region. The first transistor can also include first metal plugs on the first source/drain regions and first plug caps on the first metal plugs. The second transistor can similarly include: a second channel region, which is within a second section of a second semiconductor fin and positioned laterally between second source/drain region, and a second gate (e.g., a second replacement metal gate (RMG)), having a second gate cap and a second gate sidewall spacer, adjacent to a second top surface and second opposing sidewalls of the second section of the second semiconductor fin at the second channel region. The second transistor can also include second metal plugs on the second source/drain regions and second plug caps on the second metal plugs.

Due to the method used to form the IC structure, the width of the second semiconductor fin at the second channel region will be the same as that of the first semiconductor fin at the first channel region. However, the first channel region of the first transistor has a first height and the second channel region of the second transistor has a second height that is less than the first height. Specifically, the first and second transistors are formed with different features that ensure that the second height of the second channel region is less than the first height of the first channel region. For example, the first gate can be above and immediately adjacent to the isolation layer on either side of the first section of the first semiconductor fin and the second gate being above and immediately adjacent to an isolation region, which is on the isolation layer on either side of the second section of the second semiconductor fin. Additionally or alternatively, the first top surface of the first section of the first semiconductor fin can be above a level of the second top surface of the second section of the second semiconductor fin. Additionally or alternatively, the second section of the second semiconductor fin can include an isolation region adjacent to the second top surface. As a result of any of these different features alone and/or in combination, the gate-to-semiconductor interface length at each sidewall of the first semiconductor fin is greater than the gate-to-semiconductor interface length at each sidewall of the second semiconductor fin. Thus, the first channel region of the first transistor has a first height and the second channel region of the second transistor has a second height that is less than the first height.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 3A-3D are cross-section diagrams illustrating a partially completed IC structure formed according to the flow diagram of FIG. 1;

FIGS. 4A-4D are cross-section diagrams illustrating a partially completed IC structure formed using process flow A of the flow diagram of FIG. 1;

FIGS. 5A-5D are cross-section diagrams illustrating a partially completed IC structure formed using process flow A of the flow diagram of FIG. 1;

FIGS. 6A-6D are cross-section diagrams illustrating a partially completed IC structure formed using process flow A of the flow diagram of FIG. 1;

FIGS. 12A-12D are cross-section diagrams illustrating a partially completed IC structure formed using process flow C of the flow diagram of FIG. 1;

FIGS. 15A-15D are cross-section diagrams illustrating an IC structure formed using process flow C of the flow diagram of FIG. 1.

DETAILED DESCRIPTION

Figure 1:
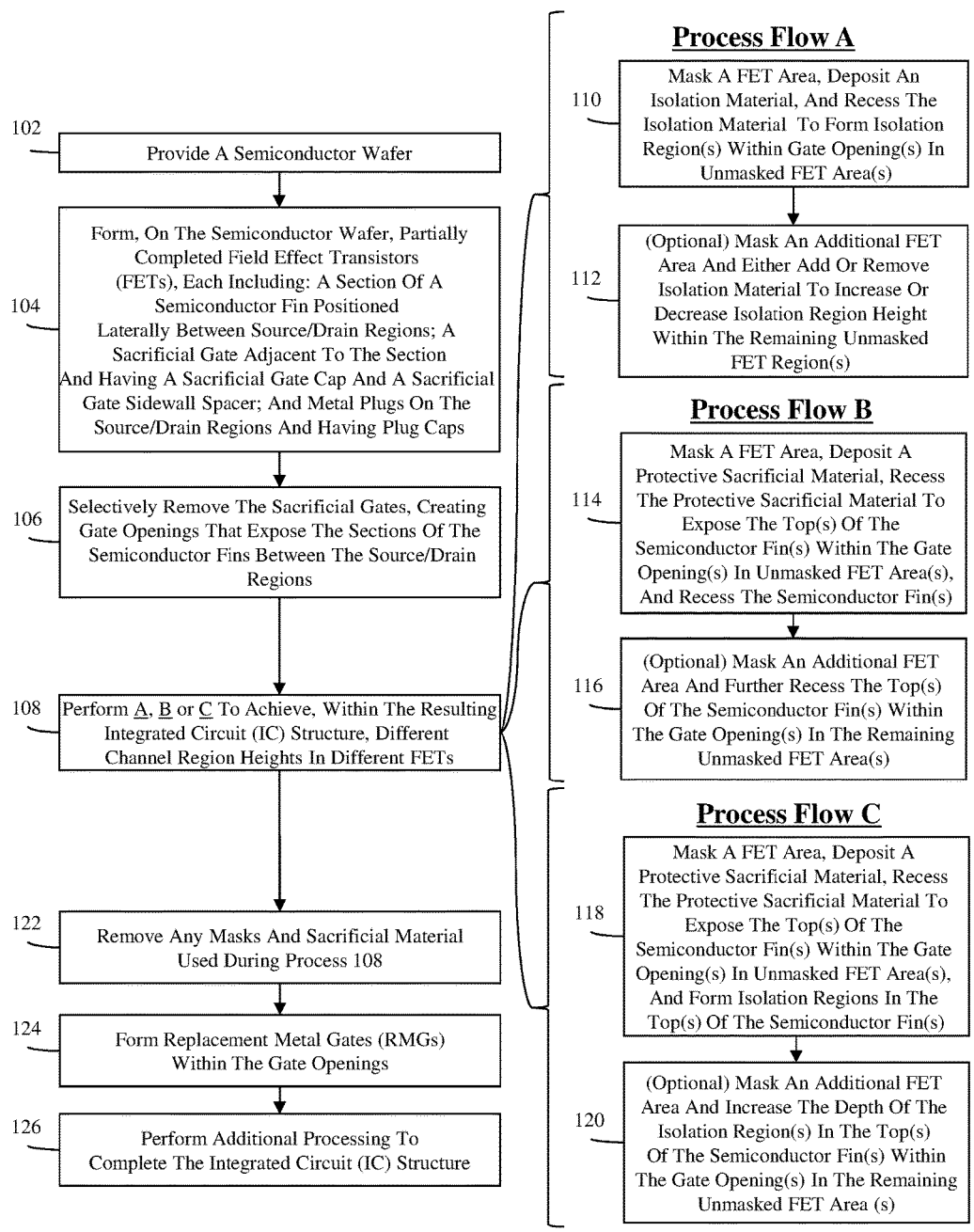
FIG. 1 is a flow diagram illustrating method embodiments for forming an integrated circuit (IC) structure that incorporates non-planar multi-gate field effect transistors (MUGFETs) having different effective channel widths.

As mentioned above, integrated circuit (IC) structures often incorporate multiple field effect transistors (FETs). For optimal circuit performance, some of the FETs may require a higher drive current as compared to others.

For example, within a static random access memory (SRAM) cell of an SRAM array, optimal circuit performance is achieved when the drive current of the pull-down FETs is higher than that of the pass-gate and pull-up FETs. More specifically, those skilled in the art will recognize that an SRAM cell and, particularly, a six-transistor (6T) SRAM cell includes a pair of N-type access FETs (also referred to as left-side and right-side pass-gate FETs) and a pair of cross-coupled inverters (also referred to as left-side and right-side inverters). Each inverter includes a P-type pull-up FET connected in series to an N-type pull-down FET. The drain of the left-side pass-gate FET is connected to a storage node between the left-side pull-up and pull-down FETs and the drain of the right-side pass-gate FET is connected to a storage node between the right-side pull-up and pull-down FETs. Furthermore, the source of the left-side pass-gate FET is connected to a left-side bitline (BL-L) of a complementary pair of bitlines, the source of the right-side pass-gate FET is be connected to a right-side bitline (BL-R) in the complementary pair of bitlines, and the gates of the pass-gate FETs are connected to the same wordline (WL).

SRAM cell operations include write operations, where a data value is stored in the cell, and read operations, where a stored data value is read from the cell. During a write operation, if a data value of "1" (i.e., a high data value) is to be written to the cell, a "1" is applied to BL-L and a "0" is applied to BL-R. Contrarily, if a data value of "0" (i.e., a low data value) is to be written to the cell, a "0" is applied to the BL-L and a "1" is applied to the BL-R. Then, when the WL is activated, the pass-gate FETs are enabled and the data value is stored. For writability (i.e., for ensuring that a previously stored data value can be flipped), there is a strong correlation to the gamma ratio (i.e., the ratio between the on-current of the pass-gate FETs (Ion_PG) and the on-current of the pull-up FETs (Ion_PU). During a reading operation, both of the BLs are pre-charged high (i.e., to a "1") and the WL is activated to enable the pass-gate FETs. When a data value of "1" is stored in the cell, the BL-L will remain charged at its pre-charge level of "1" and the BL-R will be discharged to "0" through the right-side pass-gate and pull-down FETs. When a data value of "0" is stored in the cell, the BL-L will be discharged to "0" through the left-side pass-gate and pull-down FETs and the BL-R will remain charged at its pre-charge level of "1". A sense amplifier senses whether BL-L or BL-R is higher and, thereby senses the data value that is stored in the cell. For readability (i.e., for ensuring that a stored data value can be read), the voltage difference between the bitlines must be sufficiently large to allow a difference to be sensed and the cell needs to remain stable (i.e., needs to be able to retain a stored data value following a read operation). In this case, there is a strong correlation to the beta ratio (i.e., the ratio between the on-current of the pull-down FETs (Ion_PD) and the on-current of the pass-gate FETs (Ion_PG). The two ratios (i.e., the gamma and beta ratios) present conflicting requirements for Ion_PG and the SRAM cell structure must be tuned to balance out these requirements in order to improve soft yield (i.e., to minimize soft errors or memory write or read fails).

Typically, the conflicting requirements of Ion-PG are balanced out by designing the SRAM cell so that the pull-down FETs have a larger effective channel width and, thereby a higher drive current than that the pass-gate and pull-up FETs. In non-planar multi-gate FETs (MUGFETs), such as dual-gate FETs (also referred to herein as fin-type FETs (FINFETs)) or tri-gate FETs, the different effective channel widths are often achieved by incorporating different numbers of semiconductor fins within different FETs and/or by incorporating semiconductor fins having different heights within the different FETs. Unfortunately, the use of multiple semiconductor fins increases the required chip area (i.e., increases circuit size) and the use of semiconductor fins with different heights can impact down-stream processing and cause other performance variations.

In view of the foregoing, disclosed herein are embodiments of a method of forming an integrated circuit (IC) structure that incorporates non-planar multi-gate field effect transistors (MUGFETs) having different effective channel widths. In the embodiments, sacrificial gates are selectively removed from partially completed MUGFETs to create gate openings that expose sections of semiconductor fins between source/drain regions and, prior to forming replacement metal gates in the gate openings, additional process steps are performed in order to ensure that, in the resulting IC structure, some MUGFETs have different channel region heights and, thereby different effective channel widths and different drive currents than others. The additional processing steps can include, for example, forming isolation regions in the bottoms of some gate openings. Additionally or alternatively, the additional processing steps can include filling some gate openings with a protective sacrificial material, recessing the protective sacrificial material to expose fin tops within those gate openings, either recessing the fin tops or forming isolation regions in the fin tops, and removing the protective sacrificial material. Also disclosed herein are embodiments of an IC structure formed according to the above-described method embodiments.

More particularly, FIG. 1 is a flow diagram illustrating the disclosed embodiments of a method of forming an integrated circuit (IC) structure that incorporates non-planar multi-gate field effect transistors (MUGFETs) having different effective channel widths. The method includes providing a semiconductor wafer (see process 102). The semiconductor wafer provided at process 102 can be, for example, a bulk semiconductor wafer (e.g., a bulk silicon wafer or other suitable bulk semiconductor wafer). Alternatively, the semiconductor wafer can be a semiconductor-on-insulator wafer (e.g., a silicon-on-insulator (SOI)) wafer that includes a semiconductor substrate (e.g., a silicon substrate), an insulator layer (e.g., a buried oxide (BOX) layer or other suitable insulator layer on the semiconductor substrate) and a semiconductor layer (e.g., a silicon layer or other suitable semiconductor layer) on the insulator layer.

Using this semiconductor wafer, non-planar multi-gate field effect transistor (MUGFET) processing can be initiated to form multiple MUGFETs, such as dual-gate FETs (also referred to herein as fin-type FETs (FINFETs)) or tri-gate FETs, on the semiconductor wafer. Those skilled in the art will recognize that a FINFET is a MUGFET that is formed using a tall, relatively thin semiconductor fin (i.e., an elongated, essentially rectangular-shaped, semiconductor body) having a channel region positioned laterally between source/drain regions. A gate is adjacent to the top surface and opposing sidewalls of the semiconductor fin at the channel region. Since the semiconductor fin is relatively thin, the FINFET essentially exhibits only two-dimensional field effects. That is, a FINFET exhibits field effects at the opposing sidewalls of the channel region, but any field effects exhibited at the top surface of the channel region are negligible. A tri-gate FET is a MUGFET that is similar in structure to a FINFET in that it is also formed using a semiconductor fin. However, the semiconductor fin is somewhat wider such that the tri-gate FET exhibits three-dimensional field effects (i.e., field effects at the opposing sidewalls and the top surface of the channel region).

Conventional processing for such MUGFETs (e.g., FINFETs or tri-gate FETs) typically begins with the formation of semiconductor fins (e.g., see semiconductor fins 210a-21-c). In the case of a bulk semiconductor wafer, the semiconductor fins are typically patterned and etch from an upper portion of the wafer. In the case of an SOI wafer, the semiconductor fins are typically patterned and etched through the semiconductor layer above the isolation layer. Techniques for forming such semiconductor fins (e.g., lithographic patterning techniques, sidewall image transfer techniques, replacement fin techniques, etc.) are well known in the art and, thus, the details have been omitted from this specification in order to allow the reader to focus on the salient aspects of the disclosed method. It should be noted that, for purposes of illustration, the remaining FIGS. 2A-15D show the method steps of the various embodiments being performed using a bulk semiconductor substrate 204. In this case, after formation of the semiconductor fins 210a-210c, an isolation layer 205 can be deposited and recessed so that it has an essentially uniform thickness, so that it laterally surrounds the lower portion of each semiconductor fin and so that it extends between each semiconductor fin.

Conventional processing can then continue, using the semiconductor fins 210a-210c (and, particularly, the portions of the semiconductor fins 210a-210c that extend above the isolation layer 205) to form a partially completed IC structure that includes multiple partially completed transistors having sacrificial gates (see process 104 and FIGS. 2A-2D). For purposes of illustration, three partially completed transistors 201-203 are shown in the figures. However, it should be understood that the method could be used to form any number of two or more transistors. For example, the method could be used to form groups of six transistors for six-transistor (6T) static random access memory (SRAM) cells in an SRAM array. In any case, each of these transistors can include a semiconductor fin. A section of this semiconductor fin can be positioned laterally between source/drain regions. A channel region for the transistor will subsequently be defined within this section. A sacrificial gate, having a sacrificial gate cap and a gate sidewall spacer, can be adjacent to the top surface and opposing sidewalls of the semiconductor fin at the section. Metal plugs can be on source/drain regions and plug caps can be on the metal plugs.

Figure 2A:
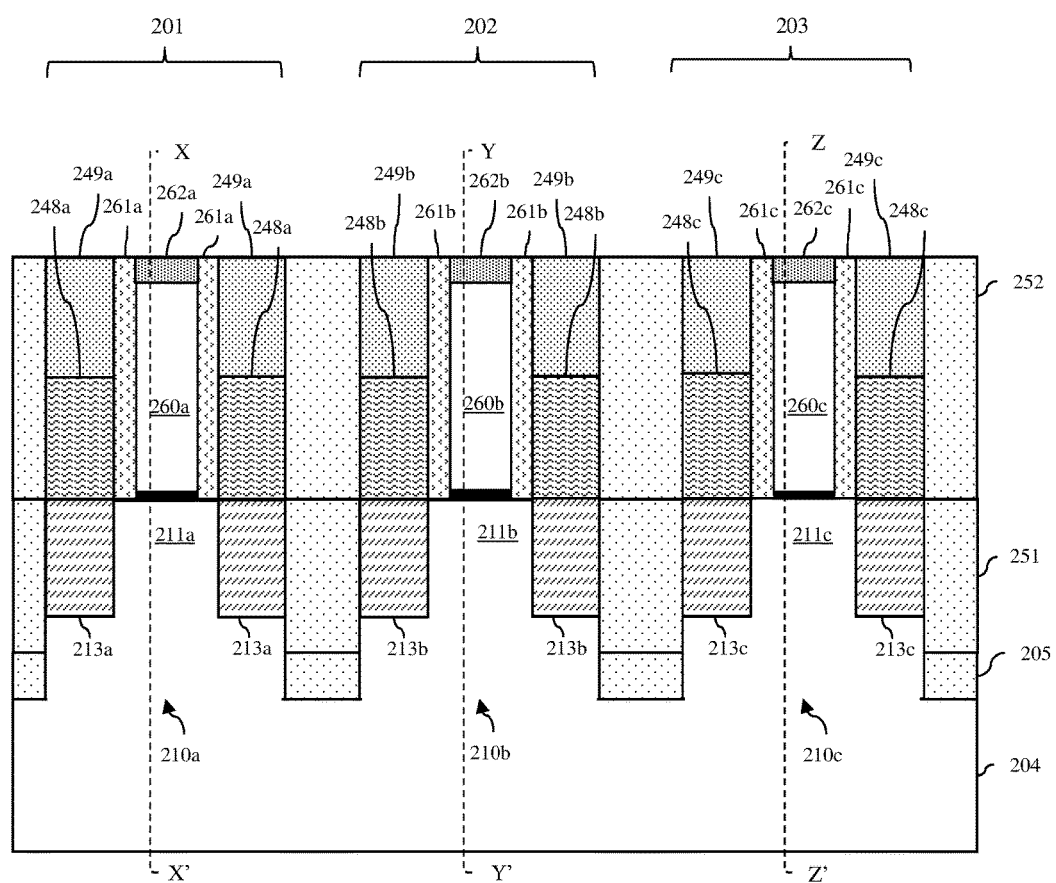
FIGS. 2A-2D are cross-section diagrams illustrating a partially completed IC structure formed according to the flow diagram of FIG. 1.
Figure 2B:
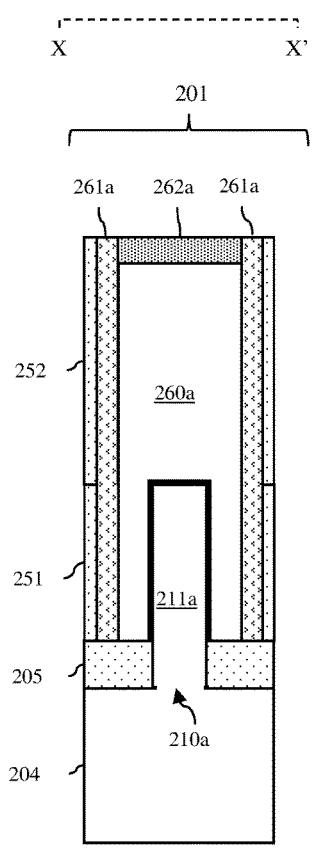
Figure 2C:
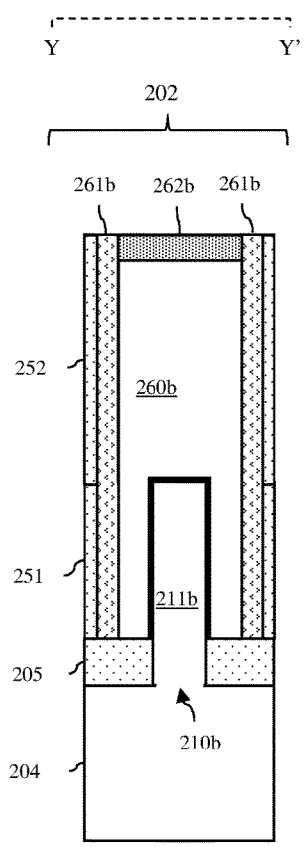
Figure 2D:
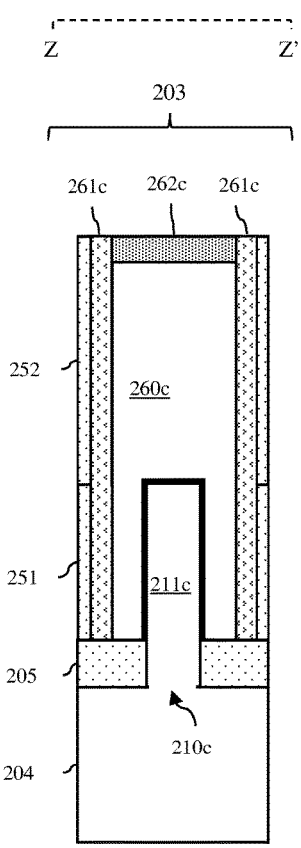
Figure 3A:
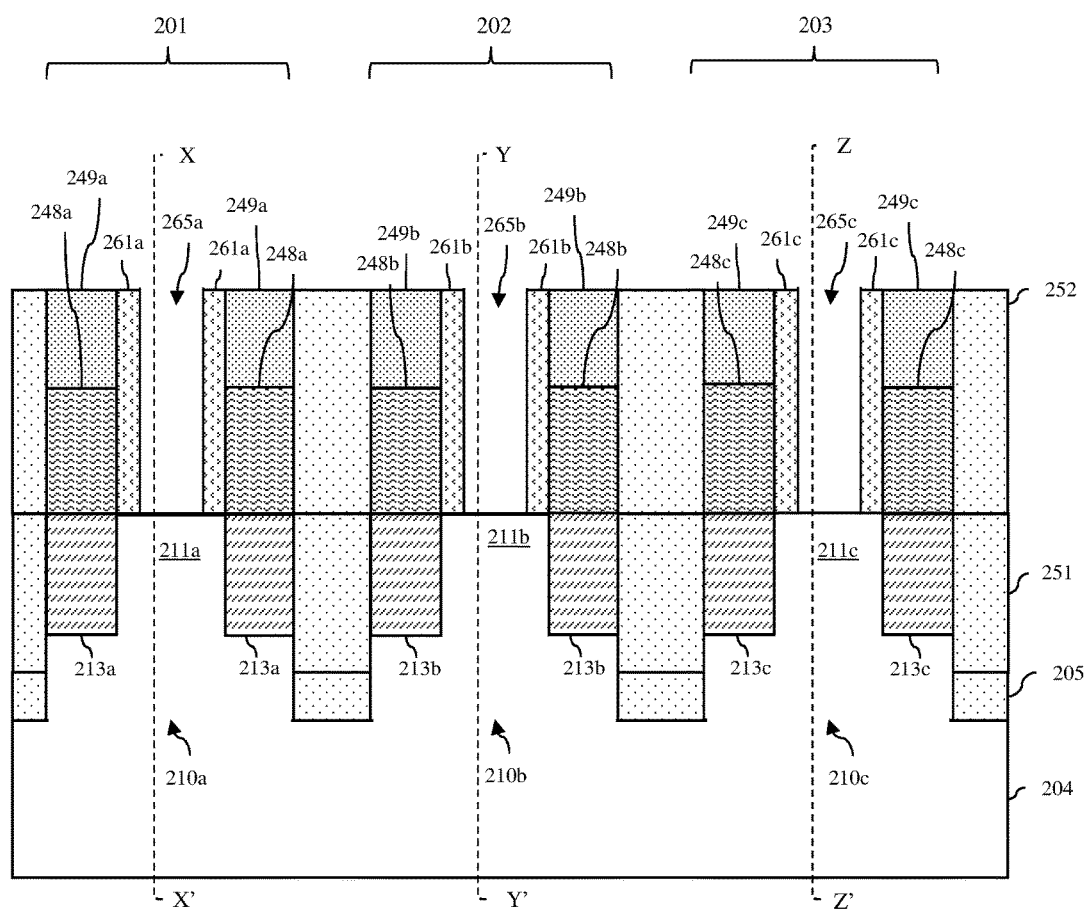
Figure 4A:
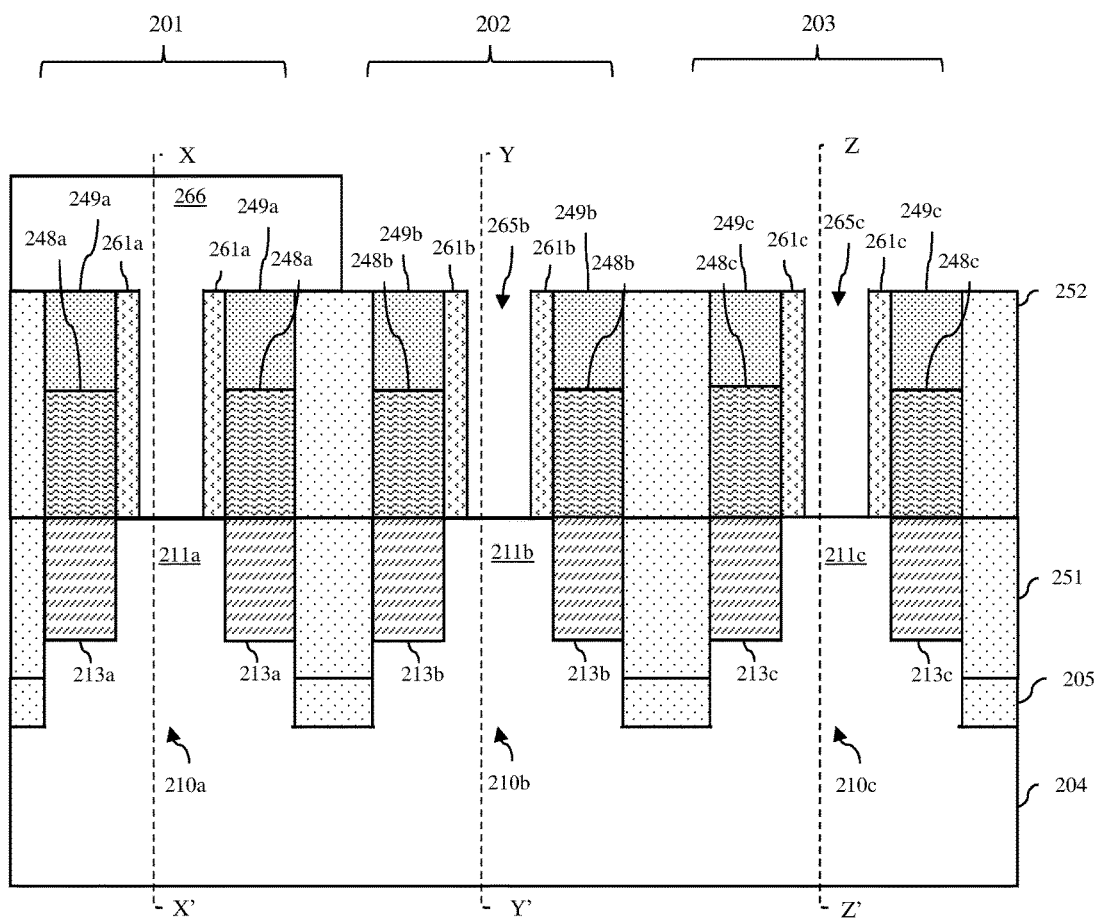
Figure 5A:
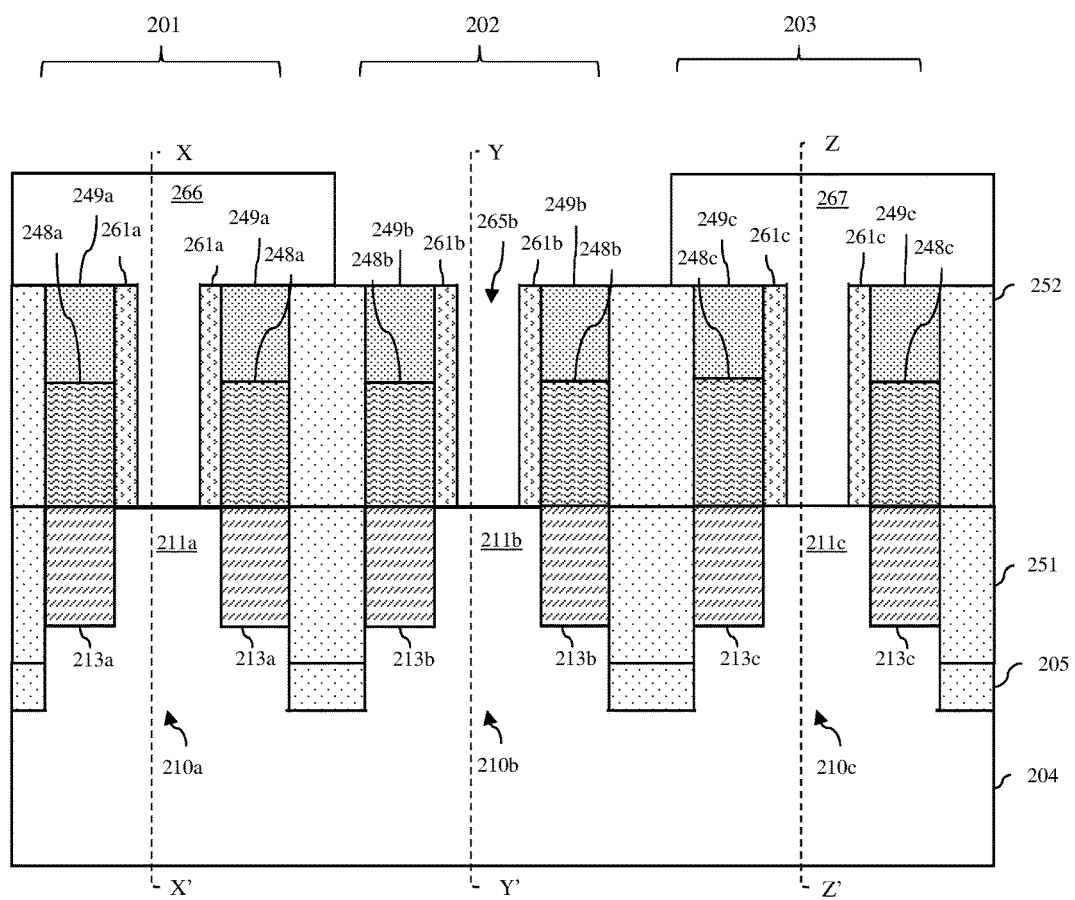
Figure 6A:
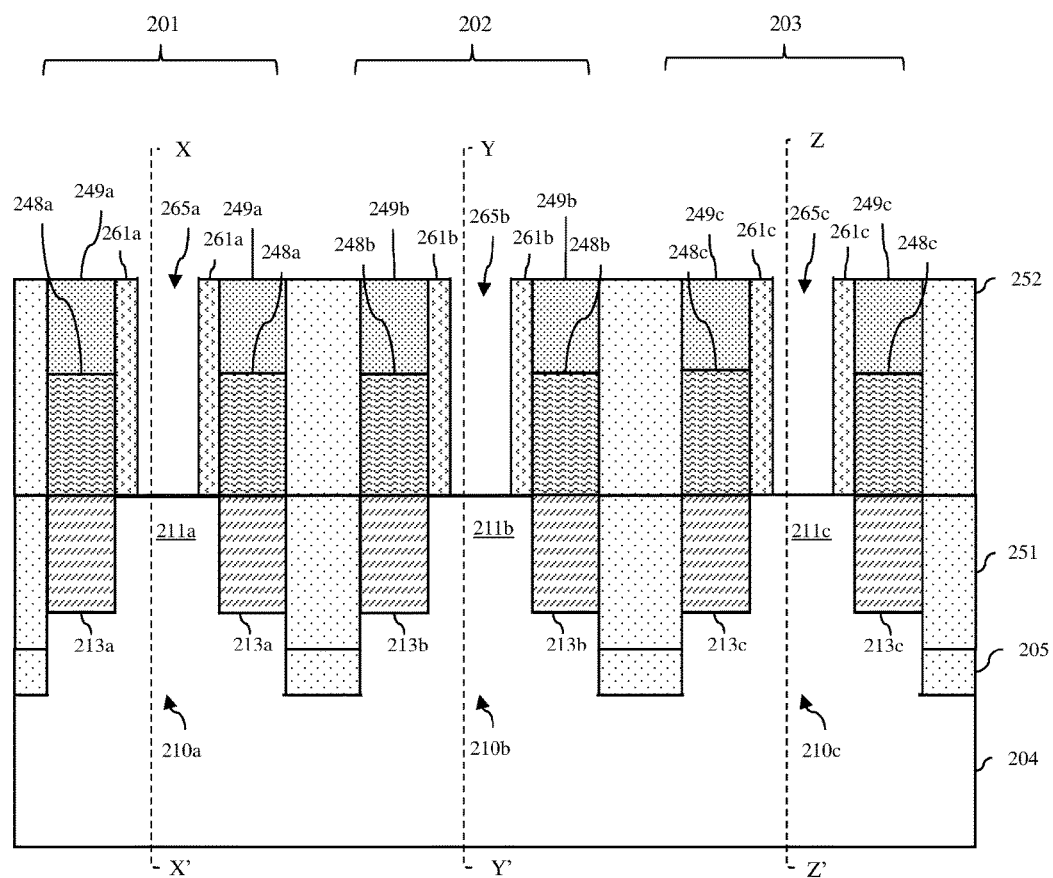

Specifically, FIG. 2A is a cross-section diagram that shows three partially completed transistors 201-203 having semiconductor fins 210a-210c and sacrificial gates 260a-260c, which traverse and are perpendicular to the semiconductor fins, respectively. The orientation of the transistors 201-203 is such that the semiconductor fins 210a-210c are positioned in end-to-end alignment and the sacrificial gates 260a-260c are parallel to each other. Thus, the cross-section of FIG. 2A shows a vertical plane that cuts across through the semiconductor fins 210a-210c across the length of each of the transistors 201-203. FIG. 2B is another cross-section diagram of this same partially completed structure and shows a different vertical plane, which is perpendicular to the vertical plane shown in FIG. 2A and which cuts across the transistor 201 at its channel region. FIG. 2C is another cross-section diagram of this same partially completed structure and shows a different vertical plane, which is perpendicular to the vertical plane shown in FIG. 2A and which cuts across the transistor 201 at its channel region. FIG. 2C is another cross-section diagram of this same partially completed structure and shows a different vertical plane, which is perpendicular to the vertical plane shown in FIG. 2A and which cuts across the transistor 203 at its channel region. FIGS. 3A-3D, 4A-4D, 5A-5D, etc. show these same cross-sections following subsequent process steps, as discussed in greater detail below. It should be noted that the orientation of the transistors 201-203 relative to each other as shown within the figures (i.e., with the semiconductor fins 210a-210c in end-to-end alignment and the sacrificial gates 260a-260c parallel) was chosen to best illustrate the similarities and differences between those transistors 201-203 during subsequent processing and in the final IC structure embodiments. However, it should be understood that this orientation as well as the lack of any connections (e.g., shared gates, shared source/drain regions, etc.) between the transistors is not intended to be limiting. Those skilled in the art will recognize that the orientation of the transistors 201-203 relative to each other as well as any connections (e.g., shared gates, shared source/drain regions, etc.) between them may vary depending upon the type of circuit and the layout of that circuit (e.g., depending upon the layout used for 6T-SRAM cells in an SRAM array).

In any case, as illustrated in FIGS. 2A-2D, following process 104, the first transistor 201 can have the following components: a first semiconductor fin 210a including first source/drain regions 213a and, positioned laterally between the first source/drain regions 213a, a first section 211a within which a first channel region will be created; a first sacrificial gate 260a, having a first sacrificial gate cap 262a and a first gate sidewall spacer 261a, adjacent to a first top surface and first opposing sidewalls of the first section 211a;

first metal plugs 248a on the first source/drain regions 213a; and first plug caps 249a on the first metal plugs 248a. The second transistor 202 can similarly have the following components: a second semiconductor fin 210b including second source/drain regions 213b and, positioned laterally between the second source/drain regions 213b, a second section 211b within which a second channel region will be created; a second sacrificial gate 260b, having a second sacrificial gate cap 262b and a second gate sidewall spacer 261b, adjacent to a second top surface and second opposing sidewalls of the second section 211b; second metal plugs 248b on the second source/drain regions 213b; and second plug caps 249b on the second metal plugs 248b. The third transistor 203 can similarly have the following components: a third semiconductor fin 210c including third source/drain regions 213c and, positioned laterally between the third source/drain regions 213c, a third section 211c within which a third channel region will be created; a third sacrificial gate 260c, having a third sacrificial gate cap 262c and a third gate sidewall spacer 261c, adjacent to a third top surface and third opposing sidewalls of the third section 211c; third metal plugs 248c on the third source/drain regions 213c; and third plug caps 249c on the third metal plugs 248c. Furthermore, one or more layers 251-252 of interlayer dielectric (ILD) material can laterally surround the transistors 201-203. It should be noted that the dimensions (i.e., heights and widths) of the semiconductor fins 210a-210c in the sections 211a-211c of these partially completed transistors 201-203 will be essentially identical. Additionally, the dimensions (i.e., heights and widths) of the semiconductor fins 210a-210c at the source/drain regions 213a-213c of these partially completed transistors 201-203 will also be essentially identical.

The transistors 201-203 described above can be formed so that they all have the same type conductivity (e.g., so that they are all N-type FETs or P-type FETs). Alternatively, at least some of the transistors 201-203 can be formed so as to have different type conductivities. In one exemplary embodiment, the first transistor 201 and the second transistor 202 can be N-type FETs and the third transistor 203 can be a P-type FET. More specifically, the first transistor 201 can be an N-type pull-down transistor of a static random access memory (SRAM) cell, the second transistor 202 can be an N-type pass-gate transistor of the SRAM cell, and the third transistor 203 can be a P-type pull-up transistor of the SRAM cell. In N-type FETs, the source/drain regions can be doped so as to have N-type conductivity at a relatively high conductivity level (e.g., N+ conductivity) and the sections within which the channel regions will be created can either be undoped or doped so as to have P-type conductivity at a relatively low conductivity level (e.g., P- conductivity). In the P-type FET, the source/drain regions can be doped so as to have P-type conductivity at a relatively high conductivity level (e.g., P+ conductivity) and the section within which the channel region will be created can either be undoped or doped so as to have N-type conductivity at a relatively low conductivity level (e.g., N- conductivity). Those skilled in the art will recognize that different dopants can be used to achieve different type conductivities and these dopants may vary depending upon the different semiconductor materials used. For example, a silicon-based semiconductor material having N-type conductivity is typically doped with a Group V dopant, such as arsenic (As), phosphorous (P) or antimony (Sb), whereas a silicon-based semiconductor material having P-type conductivity is typically doped with a Group III dopant, such as boron (B) or indium (In). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

Next, a polishing process (e.g., a chemical mechanical polishing (CMP) process) can be performed to expose the top surfaces of the sacrificial gates 260a-260c of the transistors 201-203 and the sacrificial gates 260a-260c can be selectively removed to form corresponding gate openings 265a-265c that expose the sections 211a-211c of the semiconductor fins 210a-210c, respectively (106). Specifically, sacrificial material, which was previously used to form the sacrificial gates 260a-260b, can be selectively etched over the different dielectric materials used to form the gate sidewall spacers 261a-261c, the plug caps 249a-249c and the ILD layer 252, thereby creating the gate openings 265a-265c. For example, if polysilicon or amorphous silicon was used to form the sacrificial gates, selective removal of the sacrificial gates could be achieved using a selective wet chemical etch process, such as a tetramethylammonium hydroxide (TMAH) wet chemical etch process that selectively etches polysilicon or amorphous silicon over the various dielectric materials. Alternatively, any other suitable selective etch process could be used.

In any case, as illustrated in FIGS. 3A-3D, selective removal of the first sacrificial gate 260a creates a first gate opening 265a that exposes the first section 211a of the first semiconductor fin 210a and, particularly, the first top surface and first opposing sidewalls thereof; selective removal of the second sacrificial gate 260b creates a second gate opening 265b that exposes the second section 211b of the second semiconductor fin 210b and, particularly, the second top surface and second opposing sidewalls thereof; and selective removal of the third sacrificial gate 260c creates a third gate opening 265c that exposes the third section 211c of the third semiconductor fin 210c and, particularly, the third top surface and third opposing sidewalls thereof. Additionally, portions of the top surface of the isolation layer 205 adjacent to the sections 211a-211c will be exposed at the bottoms of the gate openings 265a-265c. Also as illustrated in FIGS. 3A-3D, following process 106, the top surfaces of the exposed sections 211a-211c of the semiconductor fins 210a-210c will be essentially co-planar (i.e., will be at the same level), the same distance 230 will separate the top surfaces of each of the sections 211a-211c from the top surface of isolation material on either side of those sections (i.e., the top surface of the isolation layer 205), and the sections 211a-211b will have the same width 245.

Typically, immediately following selective removal of sacrificial gates, replacement metal gates (RMGs) would be formed within the gate openings. However, in the disclosed embodiments of the method, additional process steps are performed prior to RMG formation in order to ensure that, in the resulting IC structure, at least some of the transistors have different channel region heights and, thereby different effective channel widths and different drive currents than others (see process 108).

For example, referring to process flow A in FIG. 1, in one embodiment, a mask 266 can be formed (e.g., lithographically patterned and etched) so that it covers the area containing the first transistor 201 and, particularly, so that it extends over the first gate opening 265a (see process 110 and FIGS. 4A-4D). The areas containing the second transistor 202 and the third transistor 203 and, particularly, the second gate opening 265b and the third gate opening 265c can remain unmasked. Next, isolation material can be deposited and recessed to form isolation regions 206 within the unmasked gate openings (i.e., within the second gate opening 265b and the third gate opening 265c). Within the second gate opening 265b, the isolation region 206 will be above and immediately adjacent to the top surface of the isolation layer 205 and positioned laterally adjacent to lower portions of the second opposing sidewalls of the second section 211b of the second semiconductor fin 210b. Similarly, within the third gate opening 265c, the isolation region 206 will be above and immediately adjacent to the top surface of the isolation layer 205 and positioned laterally adjacent to lower portions of the third opposing sidewalls of the third section 211c of the third semiconductor fin 210c. As illustrated, the top surfaces of the isolation regions 206 will initially be essentially co-planar and above the level of the top surface of the isolation layer 205.

Optionally, the level of the top surface of the isolation region 206 within either gate opening can further be selectively adjusted. For example, an additional mask 267 can be formed (e.g., lithographically patterned and etched) so that it covers the area containing the third transistor 203 and, particularly, so that it extends over the third gate opening 265c (see process 112 and FIGS. 5A-5D). In this case, the area containing the first transistor 201 will remain covered by the mask 266 and the area containing the second transistor 202 will remain unmasked. Next, a selective etch process can be performed in order to recess the top surface of the exposed isolation region 206 within the second gate opening 265b relative to the top surface of the isolation region 206 within the third gate opening 265c (as shown). Thus, the isolation region 206 within the third gate opening 265c will be taller than the isolation region 206 within the second gate opening 265b (i.e., the height of the isolation region 206 within the third gate opening 265c will be greater than the height of the isolation region 206 within the second gate opening 265b). Alternatively, instead of recessing the isolation material of the isolation region within the second gate opening, additional isolation material could be added to the isolation region within the third gate opening to increase its height (not shown). That is, an additional mask could be formed (e.g., lithographically patterned and etched) so that it covers the area containing the second transistor and, particularly, so that it extends over the second gate opening. In this case, the area containing the first transistor would remain masked and the area containing the third transistor would remain unmasked. Next, additional isolation material could be deposited and then recessed, as necessary, so that the isolation region within the third gate opening will be taller than the isolation region within the second gate opening.

As a result of process flow A, the top surfaces of the sections 211a-211c of the semiconductor fins 210a-210c will remain essentially co-planar (i.e., will remain at the same level), but different distances (e.g., see distances 231-233) will separate the top surfaces of at least some of the sections 211a-211c from the top surface of isolation material on either side of those sections. Specifically, as illustrated in this case, a first distance 231 separates the first top surface of the first section 211a of the first semiconductor fin 210a from the top surface of the isolation layer 205 on either side of that first section 211a. A second distance 232, which is less than the first distance 231, separates the second top surface of the second section 211b of the second semiconductor fin 210b from the top surface of the isolation region 206, which is within the second gate opening 265b on either side of the section 211b and above the isolation layer 205. Optionally, a third distance 233, which is less than the second distance 232, separates the third top surface of the third section 211c of the third semiconductor fin 210c from the top surface of the isolation region 206, which is within the third gate opening 265c on either side of the section 211c, above the isolation layer 205, and taller than the isolation region within the second gate opening 265b.

Following the process flow A, any masks used at processes 110-112 can be selectively removed (see process 122 and FIGS. 6A-6D) and gates 270a-270c (e.g., replacement metal gates (RMGs)) for the transistors 201-203 can be formed within the gate openings 265a-265c (see process 124 and FIGS. 7A-7D).

Specifically, a first gate 270a for the first transistor 201 can be formed in the first gate opening 265a such that it is above and immediately adjacent to the top surface of the isolation layer 205 on either side of the first section 211a of the first semiconductor fin 210a, such that it is adjacent to the first top surface and the first opposing sidewalls of the first section 211a of the first semiconductor fin 210a, and such that it defines (i.e., establishes) the location of a first channel region 212a within that first section 211a. A second gate 270b for the second transistor 202 can be formed in the second gate opening 265b such that it is above and immediately adjacent to the isolation region 206 on either side of the second section 211b of the second semiconductor fin 201b, such that it is adjacent to the second top surface and second opposing sidewalls of the second section 211b of the second semiconductor fin 210b and such that it defines (i.e., establishes) the location of a second channel region 212b in that second section 211b. A third gate 270c for the third transistor 203 can be formed in the third gate opening 265c such that it is above and immediately adjacent to the isolation region 206 on either side of the third section 211c of the third semiconductor fin 210c, such that it is adjacent to the third top surface and third opposing sidewalls of the third section 211c of the third semiconductor fin 210c and such that it defines (i.e., establishes) the location of a third channel region 212c in that third section 211c.

The gates 270a-270c can be formed at process 124 using, for example, any suitable replacement metal gate (RMG) processing technique.

In one exemplary embodiment, RMG processing can include conformally depositing a gate dielectric layer so as to cover exposed surfaces of the sections 211a-211c of the semiconductor fins 210a-210c within the gate openings 265a-265c are covered. The gate dielectric layer can be, for example, a high-K gate dielectric layer. Those skilled in the art will recognize that a high-K gate dielectric material is a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The high-K dielectric layer can be subjected to a high-K reliability anneal process.

A first work function metal layer can be conformally deposited over the gate dielectric layer. The metal material or metal alloy material of the conformal first work function metal layer can be preselected in order to achieve the optimal gate conductor work function in transistors having a first type conductivity (e.g., in N-type transistors, such as the first transistor 201 and the second transistor 202). Those skilled in the art will recognize that the optimal work function for a gate conductor of an N-type FET will be, for example, between 3.9 eV and about 4.2 eV. Exemplary metals (and metal alloys), which have a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The first work function metal layer can then be chamfered and patterned so as to remove it from gate openings of transistors having a second type conductivity (e.g., from gate openings of P-type transistors, such as the third transistor 203). The chamfering process can include: depositing a protective fill material onto the first work function metal layer; recessing the protective fill material; etching away the exposed first work function metal material from above the protective fill material such that the maximum height of the first work function metal layer is below the level of the top surface of the gate sidewall spacer; and removing the protective fill material. The patterning process can include: forming a protective mask over the first and second gate openings 265a-265b, removing (e.g., selectively etching away) the first work function metal layer from the third gate opening 265c, and removing protective mask.

A second work function metal layer can then be conformally deposited over the first work function metal layer in the first and second gate openings 265a-265b and over exposed gate dielectric material in the third gate opening 265c. The metal material or metal alloy material of the conformal second work function metal layer can be preselected in order to achieve the optimal gate conductor work function in transistors having the second type conductivity (e.g., in P-type transistors). Those skilled in the art will recognize that the optimal work function for a gate conductor of a P-type transistor will be, for example, between about 4.9 eV and about 5.2 eV. Exemplary metals (and metal alloys), which have a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The second work function metal layer can then be chamfered. The chamfering process can include: depositing a protective fill material onto the second work function metal layer; recessing the protective fill material; etching away the exposed second work function metal material from above the protective fill material such that the maximum height of the second work function metal layer is below the level of the top surface of the gate sidewall spacers and removing the protective fill material.

A conductive fill material can then be deposited to fill any remaining space in the gate openings 265a-265c. This conductive fill can be any suitable metal or metal alloy fill material including, but not limited to, tungsten, a tungsten alloy (e.g., tungsten silicide or titanium tungsten), cobalt, or aluminum.

A polishing process (e.g., a CMP process) can then be performed to remove any RMG materials from above the top surface of the layer 252 of ILD material. The conductive fill material can subsequently be recessed (i.e., etched back) and a dielectric cap layer (e.g., a silicon nitride cap layer) can be deposited so as to fill the recesses formed in the gate openings above the conductive fill material. Another polishing process (e.g., another CMP process) can then be performed so as to remove any of the dielectric cap material from above the top surface of the layer 252 of ILD material, thereby forming dielectric gate caps 271a-271c on gates 270a-270c within the gate openings.

Due to the presence of the isolation region 206 in the second gate opening 265b and further due to the fact that the top surfaces of the sections 211a-210c remain essentially co-planar, the gate-to-semiconductor interface length at each sidewall of the first semiconductor fin 210a is greater than the gate-to-semiconductor interface length at each sidewall of the second semiconductor fin 210b. Furthermore, when the isolation region 206 within the third gate opening 265c is taller than the isolation region 206 within the second gate opening 265b, the gate-to-semiconductor interface length at each sidewall of the second semiconductor fin 210b will be greater than the gate-to-semiconductor interface length at each sidewall of the third semiconductor fin 210c. Thus, in the resulting IC structure embodiment 200A shown in FIGS. 7A-7D, the first channel region 212a of the first transistor 201 has a first height 231, which is equal to the first distance 231, and the second channel region 212b of the second transistor 202 has a second height, which is less than the first height and equal to the second distance 232. Furthermore, if applicable, the third channel region 212c of the third transistor 203 has a third height, which is less than the second height and equal to the third distance 233. However, the dimensions (i.e., heights and widths) of the semiconductor fins 210a-210c themselves at these channel regions will still be essentially identical. Additionally, the dimensions (i.e., heights and widths) of the semiconductor fins 210a-210c at the source/drain regions 213a-213c will remain essentially identical.

Additional processing can, subsequently, be performed in order to complete the integrated circuit (IC) structure embodiment 200A (see process 126). This additional processing can include, but is not limited to, middle of the line (MOL) processing (e.g., the formation of source/drain contacts to the metal plugs and the formation of gate contacts to gates); and back end of the line (BEOL) processing (e.g., the formation of BEOL metal levels).

Alternatively, referring to process flow B in FIG. 1, in another embodiment, a mask 266 can be formed (e.g., lithographically patterned and etched) so that it covers the area containing the first transistor 201 and, particularly, so that it extends over the first gate opening 265a (see process 114 and FIGS. 8A-8D). The areas containing the second transistor 202 and the third transistor 203 and, particularly, the second gate opening 265b and the third gate opening 265c can remain unmasked. Next, protective sacrificial material 207 can be deposited into the unmasked gate openings and recessed to expose the second top surface of the second section 211b of the second semiconductor fin 210b within the second gate opening 265b and the third top surface of the third section 211c of the third semiconductor fin 210c within the third gate opening 265c. The sacrificial material 207 can be, for example, amorphous carbon or any other suitable sacrificial material that can be selectively removed (i.e., selectively etched) over the semiconductor material of the semiconductor fins as well as over the adjacent dielectric materials. The exposed second and third top surfaces can then be recessed (i.e., etched back). For example, an anisotropic etch process that is selective for the semiconductor material of the semiconductor fins over the adjacent sacrificial and other materials can be performed and timed so as to recess the second top surface of the second section 211b of the second semiconductor fin 210b and the third top surface of the third section 211c of the third semiconductor fin 210c. Alternatively, an oxidation process can be performed to form oxide isolation regions in the tops of the second and third sections 211b-211c. The oxide isolation regions can then be selectively removed, effectively recessing the second and third top surfaces.

Optionally, the level of the top surface of the third section 211c of the third semiconductor fin 210c can be further adjusted. For example, an additional mask 268 can be formed (e.g., lithographically patterned and etched) so that it covers the area containing the second transistor 202 and, particularly, so that it extends over the second gate opening 265b (see process 116 and FIGS. 9A-9D). The area containing the first transistor 201 will remain covered by the mask 266 and the area containing the third transistor 203 will remain unmasked. The exposed third top surface of the third section 211c of the third semiconductor fin 210c can then be further recessed (e.g., using either of the techniques described above) relative to the second top surface of the second section 211b of the second semiconductor fin 210b (as shown).

As a result of process flow B, the top surfaces of at least some of the sections 211a-211c of the semiconductor fins 210a-210c will be at different levels such that different distances separate these top surfaces from the top surface of isolation material on either side of those sections. Specifically, as illustrated in FIGS. 9A-9D, a first distance 231 separates the first top surface of the first section 211a of the first semiconductor fin 210a from the top surface of the isolation layer 205 on either side of that first section 211a and a second distance 232, which is less than the first distance 231, separates the second top surface of the second section 211b of the second semiconductor fin 210b from the top surface of the isolation layer 205. Optionally, a third distance 233, which is less than the second distance 232, separates the third top surface of the third section 211c of the third semiconductor fin 210c from the top surface of the isolation layer 205.

Following the process flow B, any masks used at processes 114-116 can be selectively removed (see process 122 and FIGS. 10A-10D) and the protective sacrificial material 207 can also be selectively removed. The protective sacrificial material 207 (e.g., amorphous carbon) can, for example, be removed using a reactive ion etch process, which uses a plasma of oxygen, hydrogen, nitrogen, sulfur dioxide, carbon mono oxide (CO), carbon dioxide (CO2) or combinations thereof. Alternatively, this protective sacrificial material 207 can be removed using any other suitable controllable selective etch process that selectively etches the sacrificial material over other exposed materials. It should be noted that, due to the presence of the protective sacrificial material 207, when the second and third top surfaces of the second and third sections 211b-211c of the second and third semiconductor fins 210b-210c, respectively, are recessed, the opposing sidewalls of those sections are protected (i.e., the sides of the sections 211b-211c will not also be etched). Furthermore, since this protective sacrificial material 207 is removed using a controllable selective etch process that avoids any significant etching of other exposed materials including exposed horizontal or vertical surfaces of the semiconductor fins, this method embodiment allows for precise control of the different levels of the top surfaces of the sections 211a-c and further ensures that the sections 211a-211c will have essentially the same width 245 in the completed IC structure.

Then, gates 270a-270c for the transistors 201-203 can be formed within the gate openings 265a-265c (see process 124 and FIGS. 11A-11D). Specifically, a first gate 270a for the first transistor 201 can be formed in the first gate opening 265a such that it is above and immediately adjacent to the top surface of the isolation layer 205 on either side of the first section 211a of the first semiconductor fin 210a, such that it is adjacent to the first top surface and the first opposing sidewalls of the first section 211a of the first semiconductor fin 210a, and such that it defines (i.e., establishes) the location of a first channel region 212a within that first section 211a. A second gate 270b for the second transistor 202 can be formed in the second gate opening 265b such that it is above and immediately adjacent to the top surface of the isolation layer 205 on either side of the second section 211b of the second semiconductor fin 201b, such that it is adjacent to the second top surface and second opposing sidewalls of the second section 211b of the second semiconductor fin 210b and such that it defines (i.e., establishes) the location of a second channel region 212b in that second section 211b. A third gate 270c for the third transistor 203 can be formed in the third gate opening 265c such that it is above and immediately adjacent to the top surface of the isolation layer 205 on either side of the third section 211c of the third semiconductor fin 210c, such that it is adjacent to the third top surface and third opposing sidewalls of the third section 211c of the third semiconductor fin 210c and such that it defines (i.e., establishes) the location of a third channel region 212c in that third section 211c.

The gates 270a-270c can be formed at process 124 using the same exemplary RMG technique described above or any other suitable RMG processing technique.

Due to the fact that the first top surface of the first section 211a of the first semiconductor fin 210a is at a higher level than the second top surface of the second section 211b of the second semiconductor fin 210b, the gate-to-semiconductor interface length at each sidewall of the first semiconductor fin 210a is greater than the gate-to-semiconductor interface length at each sidewall of the second semiconductor fin 210b. Furthermore, when the second top surface of the second section 211b of the second semiconductor fin 210b is at a higher level than the third top surface of the third section 211c of the third semiconductor fin 210c, the gate-to-semiconductor interface length at each sidewall of the second semiconductor fin 210b will be greater than the gate-to-semiconductor interface length at each sidewall of the third semiconductor fin 210c. Thus, in the resulting IC structure embodiment 200B shown in FIGS. 11A-11D, the first channel region 212a of the first transistor 201 has a first height, which is equal to the first distance 231, and the second channel region 212b of the second transistor 202 has a second height, which is less than the first height and equal to the second distance 232. Furthermore, if applicable, the third channel region 212c of the third transistor 203 has a third height, which is less than the second height and equal to the third distance 233. However, the widths of the semiconductor fins 210a-210c at the channel regions will remain essentially identical. Additionally, the dimensions (i.e., heights and widths) of the semiconductor fins 210a-210c at the source/drain regions 213a-213c will also remain essentially identical.

Additional processing can, subsequently, be performed in order to complete the integrated circuit (IC) structure embodiment 200B (see process 126). This additional processing can include, but is not limited to, middle of the line (MOL) processing (e.g., the formation of source/drain contacts to the metal plugs and the formation of gate contacts to gates); and back end of the line (BEOL) processing (e.g., the formation of BEOL metal levels).

Alternatively, referring to process flow C in FIG. 1, in yet another embodiment, a mask 266 can be formed (e.g., lithographically patterned and etched) so that it covers the area containing the first transistor 201 and, particularly, so that it extends over the first gate opening 265a (see process 118 and FIGS. 12A-12D). The areas containing the second transistor 202 and the third transistor 203 and, particularly, the second gate opening 265b and the third gate opening 265c can remain unmasked. Next, protective sacrificial material 207 can be deposited and recessed to expose the second top surface of the second section 211b of the second semiconductor fin 210b within the second gate opening 265b and the third top surface of the third section 211c of the third semiconductor fin 210c within the third gate opening 265c. The sacrificial material 207 can be, for example, amorphous carbon or any other suitable sacrificial material that can be selectively removed (i.e., selectively etched) over the semiconductor material of the semiconductor fins as well as over the adjacent dielectric materials.

The isolation regions 208 can then be formed within the second and third sections 211b-211b adjacent to the second and third top surfaces, respectively. The isolation regions 208 can be formed as oxide regions or as dopant implant regions. That is, an oxidation process can be performed in order to form oxide regions within the tops of the second and third sections 211b-211c. Alternatively, one or more dopant implantation process(es) can be performed in order to form dopant implantation regions in the tops of the second and third sections 211b-211c. It should be understood that if the conductivity types of the second transistor 202 and the third transistor are different, then the conductivity types of these dopant implantation isolation regions will also need to be different to achieve the desired isolation. For example, for an N-type transistor (e.g., if the second transistor 202 is an N-type pass-gate transistor of an SRAM cell), the dopant implantation region should have P-type conductivity at a relatively high conductivity level (i.e., should be a P+ region). For a P-type transistor (e.g., if the third transistor 203 is a P-type pull-up transistor of an SRAM cell), the dopant implantation region should have N-type conductivity at a relatively high conductivity level (i.e., should be an N+ region). In this case, discrete masked dopant implantation processes would be required.

Optionally, the depth of the isolation region 208 within the third section 211c of the third semiconductor fin 210c can be increased relative to the depth of the isolation region 208 within the second section 211b of the second semiconductor fin 210b. For example, an additional mask 268 can be formed (e.g., lithographically patterned and etched) so that it covers the area containing the second transistor 202 and, particularly, so that it extends over the second gate opening 265b (see process 120 and FIGS. 13A-13D). The area containing the first transistor 201 will remain covered by the mask 266 and the area containing the third transistor 203 will remain unmasked. Then, an additional oxidation or dopant implantation process can be performed in order to increase the depth of the isolation region 208 at the third top surface of the third section 211c of the third semiconductor fin 210c (as shown).

As a result of process flow C, the actual top surfaces of the sections 211a-211c of the semiconductor fins 210a-210c will remain essentially co-planar. However, the effective top surfaces of the sections 211b and 211c will be at the bottoms of the isolation regions 208 and different distances will separate these effective top surfaces from the top surface of isolation material on either side of those sections. Specifically, a first distance 231 will separate the first top surface of the first section 211a of the first semiconductor fin 210a from the top surface of the isolation layer 205 on either side of that first section 211a. A second distance 232, which is less than the first distance 231, will separate the bottom of the isolation region 208 within the second section 211b of the second semiconductor fin 210b from the top surface of the isolation layer 205. Optionally, a third distance 233, which is less than the second distance 232, will separate the bottom of the isolation region 208 within the third section 211c of the third semiconductor fin 210c from the top surface of the isolation layer 205.

Following the process flow C, any masks used at processes 118-120 can be selectively removed (see process 122 and FIGS. 14A-14D) and the protective sacrificial material 207 can also be selectively removed. The protective sacrificial material 207 (e.g., amorphous carbon) can, for example, be removed using a reactive ion etch process, which uses a plasma of oxygen, hydrogen, nitrogen, sulfur dioxide, carbon mono oxide (CO), carbon dioxide ($CO_2$) or combinations thereof. Alternatively, this protective sacrificial material 207 can be removed using any other suitable controllable selective etch process that selectively etches the sacrificial material over other exposed materials. It should be noted that, due to the presence of the protective sacrificial material 207, when the isolation regions 208 are formed in the tops of the second and third sections 211b-211c of the second and third semiconductor fins 210b-210c, respectively, the opposing sidewalls of those sections are protected (i.e., isolation regions are not also formed in the sides of sections 211b-211c). Furthermore, since this protective sacrificial material 207 (e.g., amorphous carbon) can be removed using a controllable selective etch process that avoids any significant etching of other exposed materials including exposed horizontal or vertical surfaces of the semiconductor fins, this method embodiment allows for precise control of the locations of the isolation regions and further ensures that the sections 211a-211c will have essentially the same width 245 in the completed IC structure.

Then, gates 270a-270c for the transistors 201-203 can be formed within the gate openings 265a-265c (see process 124 and FIGS. 15A-15D). Specifically, a first gate 270a for the first transistor 201 can be formed in the first gate opening 265a such that it is above and immediately adjacent to the top surface of the isolation layer 205 on either side of the first section 211a of the first semiconductor fin 210a, such that it is adjacent to the first top surface and the first opposing sidewalls of the first section 211a of the first semiconductor fin 210a, and such that it defines (i.e., establishes) the location of a first channel region 212a within that first section 211a. A second gate 270b for the second transistor 202 can be formed in the second gate opening 265b such that it is above and immediately adjacent to the top surface of the isolation layer 205 on either side of the second section 211b of the second semiconductor fin 201b, such that it is adjacent to the second top surface and second opposing sidewalls of the second section 211b of the second semiconductor fin 210b and such that it defines (i.e., establishes) the location of a second channel region 212b in that second section 211b. A third gate 270c for the third transistor 203 can be formed in the third gate opening 265c such that it is above and immediately adjacent to the top surface of the isolation layer 205 on either side of the third section 211c of the third semiconductor fin 210c, such that it is adjacent to the third top surface and third opposing sidewalls of the third section 211c of the third semiconductor fin 210c and such that it defines (i.e., establishes) the location of a third channel region 212c in that third section 211c.

The gates 270a-270c can be formed at process 124 using the same exemplary RMG technique described above or any other suitable RMG processing technique.

Due to the presence of the isolation region 208 within the second section 211b of the second semiconductor fin 210b, the first top surface of the first section 211a of the first semiconductor fin 210a is at a higher level than the effective top surface of the second section 211b of the second semiconductor fin 210b. Thus, the gate-to-semiconductor interface length at each sidewall of the first semiconductor fin 210a is greater than the gate-to-semiconductor interface length at each sidewall of the second semiconductor fin 210b. Furthermore, when an isolation region 208 in the top of the third section 211c of the third semiconductor fin 210c extends deeper than the isolation region 208 in the top of the second section 211b, the gate-to-semiconductor interface length at each sidewall of the second semiconductor fin 210b will be greater than the gate-to-semiconductor interface length at each sidewall of the third semiconductor fin 210c. Thus, in the resulting IC structure embodiment 200C of FIGS. 15A-15D, the first channel region 212a of the first transistor 201 has a first height, which is equal to the first distance 231, and the second channel region 212b of the second transistor 202 has a second height, which is less than the first height and equal to the second distance 232. Furthermore, if applicable, the third channel region 212c of the third transistor 203 has a third height, which is less than the second height and equal to the third distance 233. However, the widths of the semiconductor fins 210a-210c at the channel regions will remain essentially identical. Additionally, the dimensions (i.e., heights and widths) of the semiconductor fins 210a-210c at the source/drain regions 213a-213c will also remain essentially identical.

Additional processing can, subsequently, be performed in order to complete the integrated circuit (IC) structure embodiment 200C (see process 126). This additional processing can include, but is not limited to, middle of the line (MOL) processing (e.g., the formation of source/drain contacts to the metal plugs and the formation of gate contacts to gates); and back end of the line (BEOL) processing (e.g., the formation of BEOL metal levels).

The above-described method embodiments can be used to selective adjust the channel region heights 231-233 of different transistors 201-203 and thereby to selectively adjust the effective channel widths and the drive currents of those transistors 201-203. Thus, in the embodiment where the first transistor 201 is an N-type pull-down transistor of an SRAM and the second transistor 202 is an N-type pass-gate transistor of the SRAM, the channel region height 232 of the N-type pass-gate transistor can be reduced relative to the channel region height 231 of the N-type pull-down resistor to balance out the conflicting requirements for Ion_PG in the gamma and beta ratios in the SRAM cell structure and, thereby improve soft yield (i.e., to minimize soft errors or memory write or read fails). Furthermore, if the third transistor 203 is a P-type pull-up transistor of the SRAM, the channel region height 233 of the P-type pull-up transistor can be reduced relative to the channel region height 232 of the N-type pass-gate transistor to further improve performance. Furthermore, since the method embodiments provide a means to precisely control the different channel regions heights without causing other transistor-to-transistor structural variations (e.g., different fin widths, etc.), the method embodiments provide a means for avoiding or at least minimizing unintended performance variations between transistors within the resulting IC structure.

Referring to FIGS. 7A-7D, 11A-11D and 15A-15D, also disclosed herein are embodiments 200A, 200B and 200C, respectively, of an integrated circuit (IC) structure formed according to the above-described method embodiments.

Each of the embodiments 200A-200C of the IC structure can include a semiconductor substrate 204 and, on the semiconductor substrate 204, an isolation layer 205 that has an essentially uniform thickness and multiple semiconductor fins (e.g., see the first semiconductor fin 210a, the second semiconductor fin 210b and the third semiconductor fin 210c).

As described in detail above with regard to the method, the semiconductor substrate 204 can be a bulk semiconductor substrate (e.g., a bulk silicon substrate), the semiconductor fins 210a-210c can be patterned in an upper portion of the bulk semiconductor substrate 204, and the isolation layer 205 can laterally surround the lower portions of the semiconductor fins and can extend between each semiconductor fin. Alternatively, the semiconductor fins can be patterned in the semiconductor layer of a semiconductor-on-insulator wafer (e.g., silicon-on-insulator (SOI) wafer). In any case, the isolation layer 205 has an essentially planar top surface such that portions of the top surface of the isolation layer 205 adjacent to the semiconductor fins 210a-210c are at the same level (i.e., co-planar).

Each of the embodiments 200A-200C of the IC structure can further include multiple transistors 201-203 (e.g., non-planar multi-gate field effect transistors (MUGFETs), such as fin-type field effect transistors (FINFETs) or tri-gate FETs) above the isolation layer 205. For purposes of illustration, three transistors are shown; however, it should be understood that, alternatively, the IC structure could include any number of two or more transistors. The first transistor 201 can include: a first channel region 212a, which is within a first section of a first semiconductor fin 210a and positioned laterally between first source/drain region 213a, and a first gate 270a (e.g., a first replacement metal gate (RMG)), having a first gate cap 271a and a first gate sidewall spacer 261a, adjacent to a first top surface and first opposing sidewalls of the first section of the first semiconductor fin 210a at the first channel region 212a. The first transistor 201 can also include first metal plugs 248a on the first source/drain regions 213a and first plug caps 249a on the first metal plugs 248a. The second transistor 202 can similarly include: a second channel region 212b, which is within a second section of a second semiconductor fin 210b and positioned laterally between second source/drain region 213b, and a second gate 270b (e.g., a second replacement metal gate (RMG)), having a second gate cap 271b and a second gate sidewall spacer 261b, adjacent to a second top surface and second opposing sidewalls of the second section of the second semiconductor fin 210b at the second channel region 212b. The second transistor 202 can also include second metal plugs 248b on the second source/drain regions 213b and second plug caps 249b on the second metal plugs 248b. The third transistor 203 can similarly include: a third channel region 212c, which is within a third section of a third semiconductor fin 210c and positioned laterally between third source/drain region 213c, and a third gate 270c (e.g., a second replacement metal gate (RMG)), having a third gate cap 271c and a third gate sidewall spacer 261c, adjacent to a third top surface and third opposing sidewalls of the third section of the third semiconductor fin 210c at the third channel region 212c. The third transistor 203 can also include third metal plugs 248c on the third source/drain regions 213c and third plug caps 249c on the third metal plugs 248c.

Figure 7A:
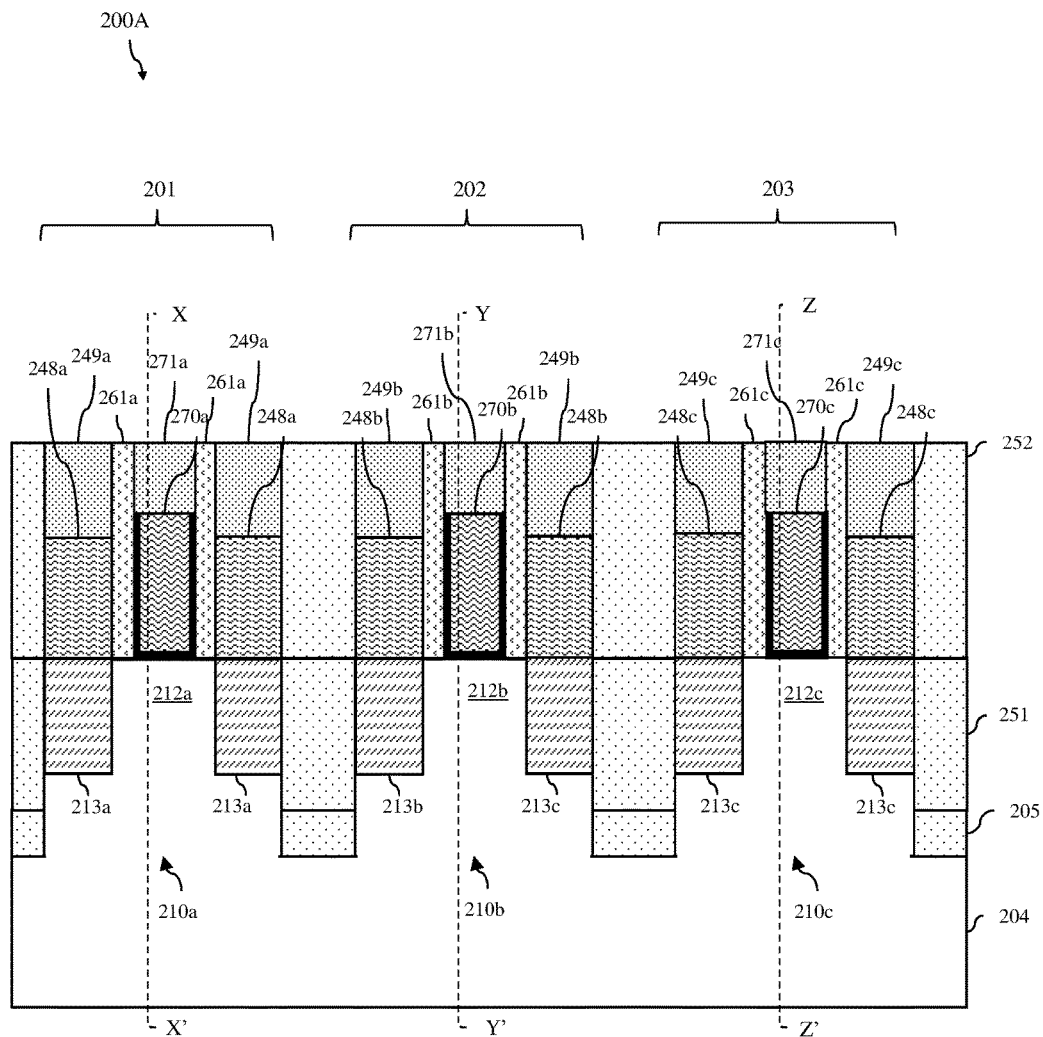
FIGS. 7A-7D are cross-section diagrams illustrating an IC structure embodiment formed using process flow A in the flow diagram of FIG. 1.
Figures 7B, 7C, 7D:
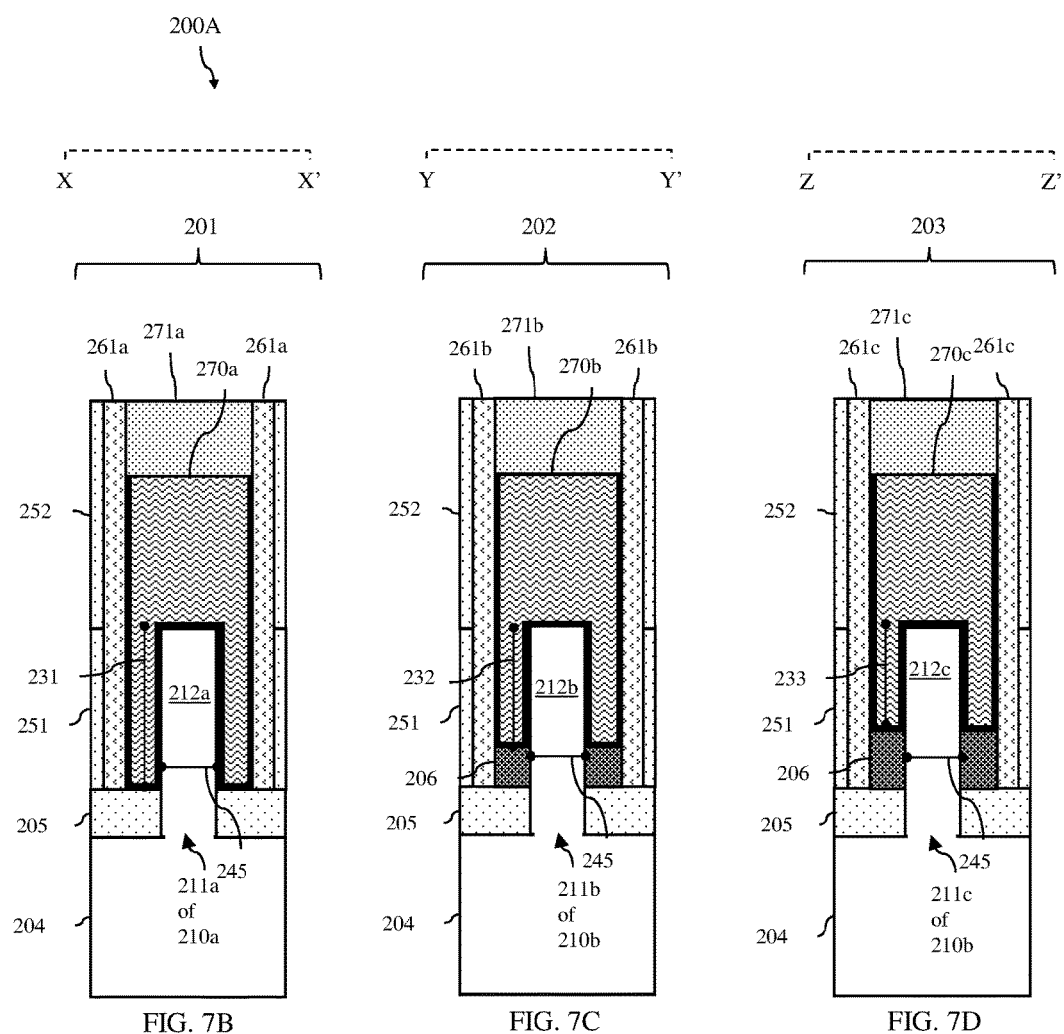
Figure 8A:
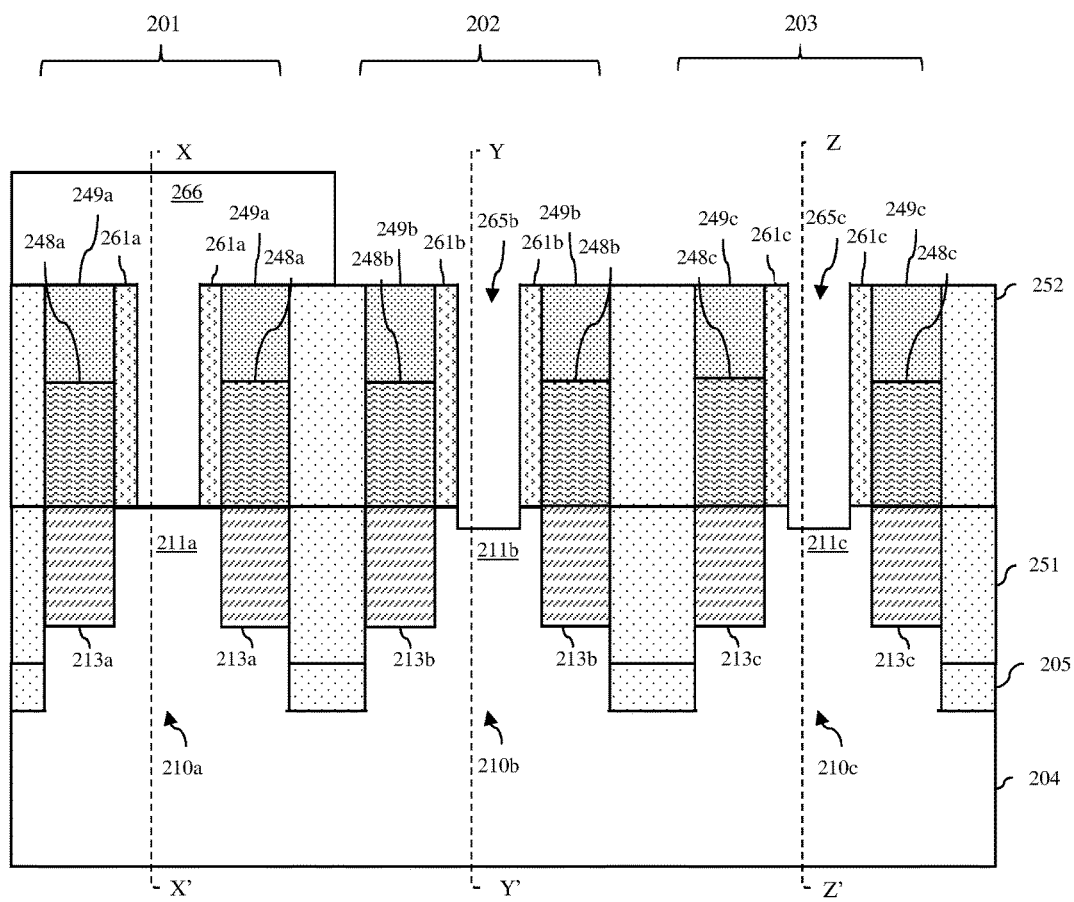
FIGS. 8A-8D are cross-section diagrams illustrating a partially completed IC structure formed using process flow B of the flow diagram of FIG. 1.
Figures 8B, 8C, 8D:
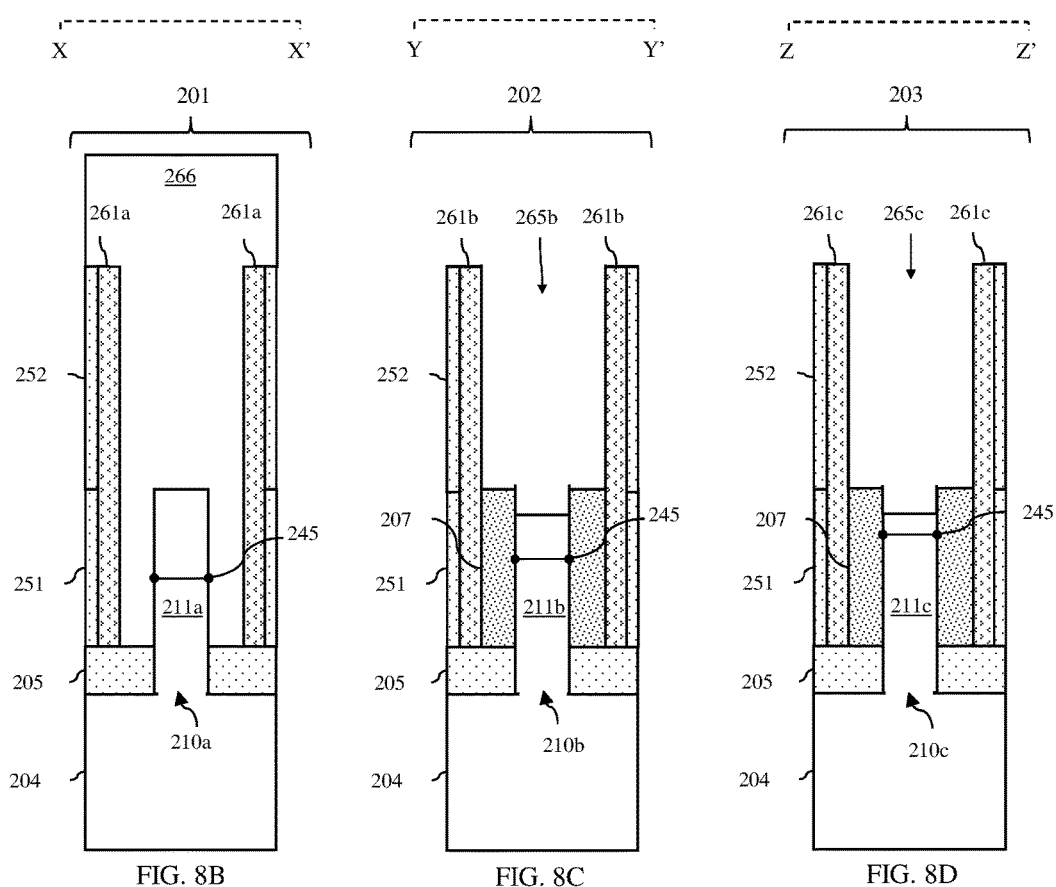
Figure 9A:
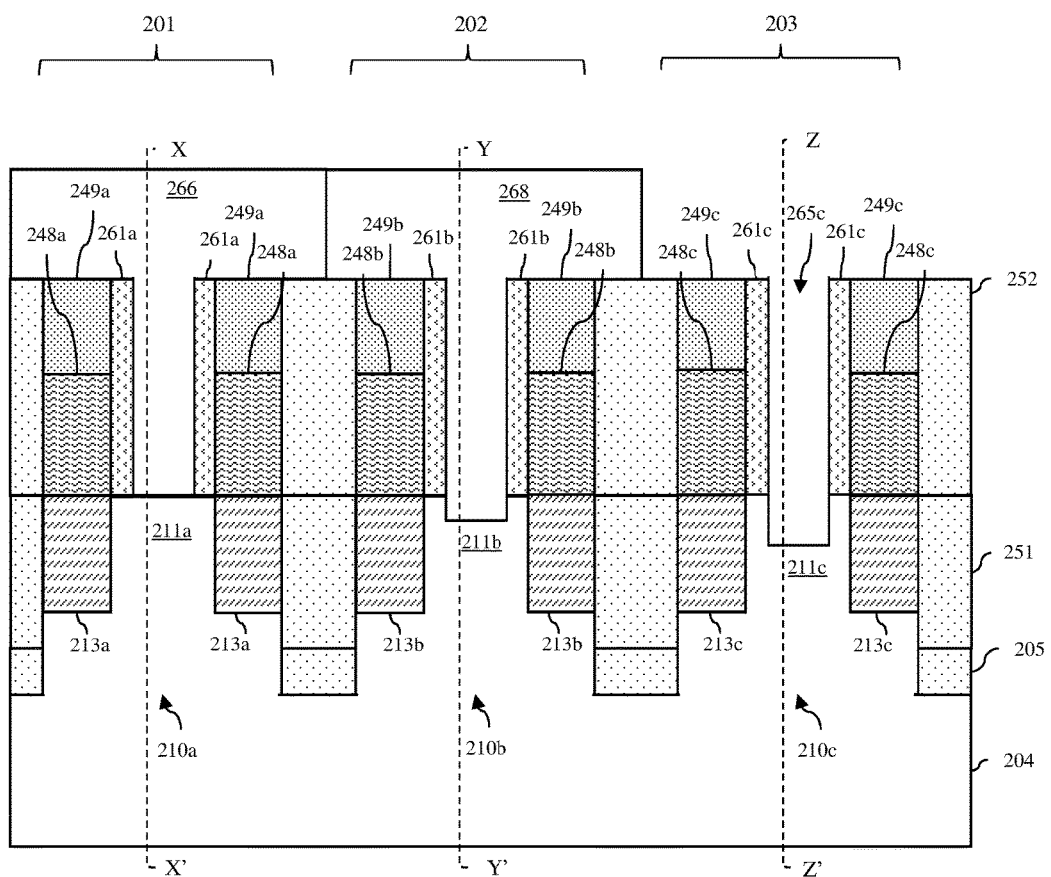
FIGS. 9A-9D are cross-section diagrams illustrating a partially completed IC structure formed using process flow B of the flow diagram of FIG. 1.
Figures 9B, 9C, 9D:
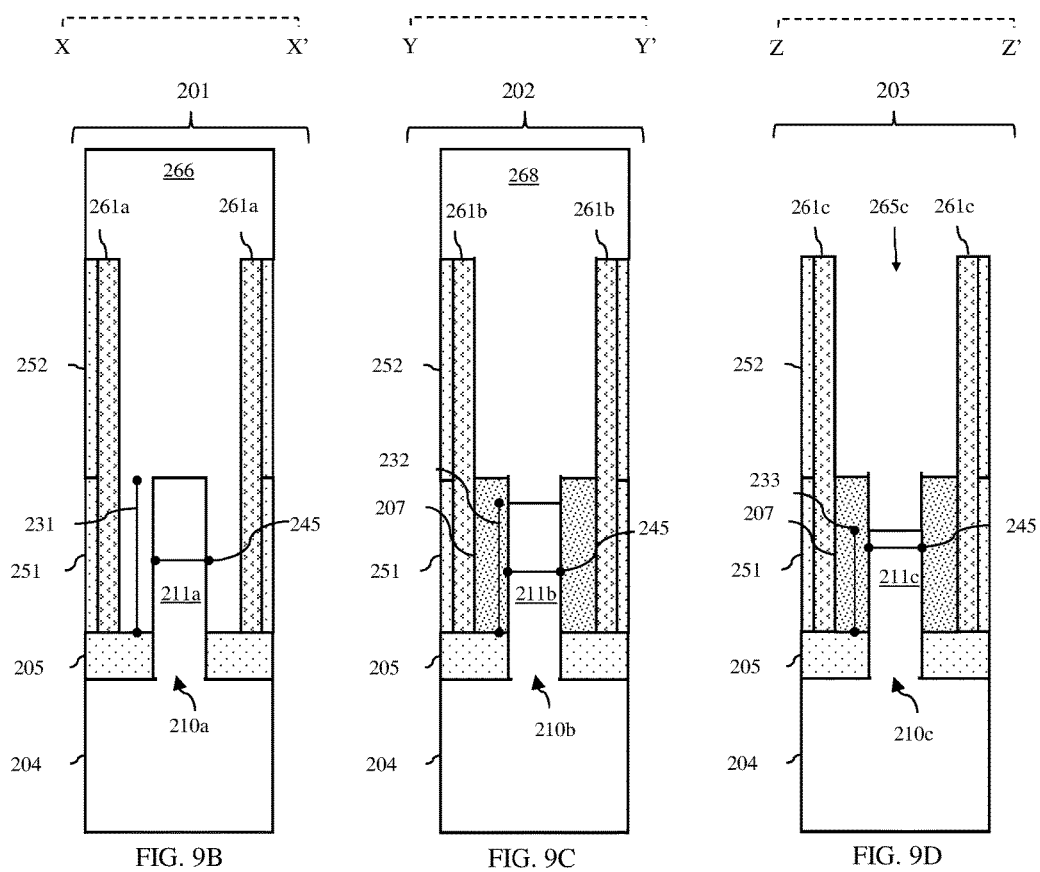
Figure 10A:
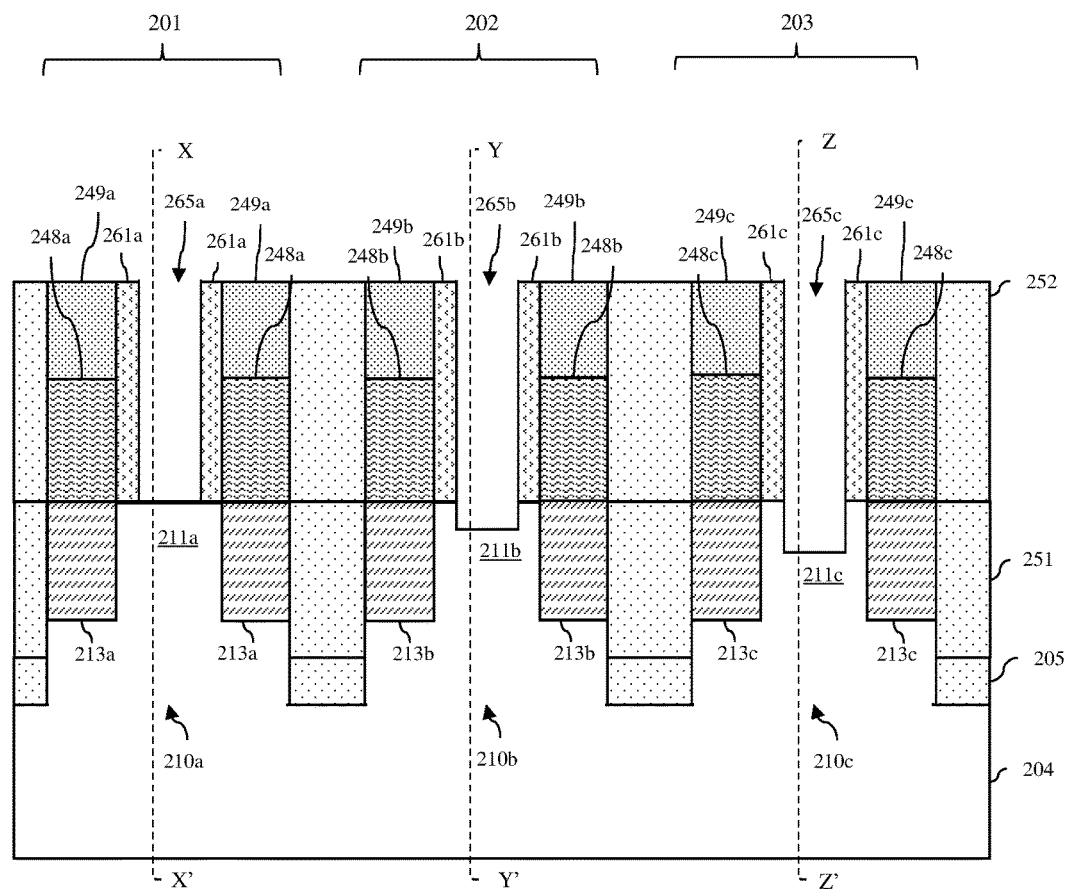
FIGS. 10A-10D are cross-section diagrams illustrating a partially completed IC structure using process flow B of the flow diagram of FIG. 1.
Figures 10B, 10C, 10D:
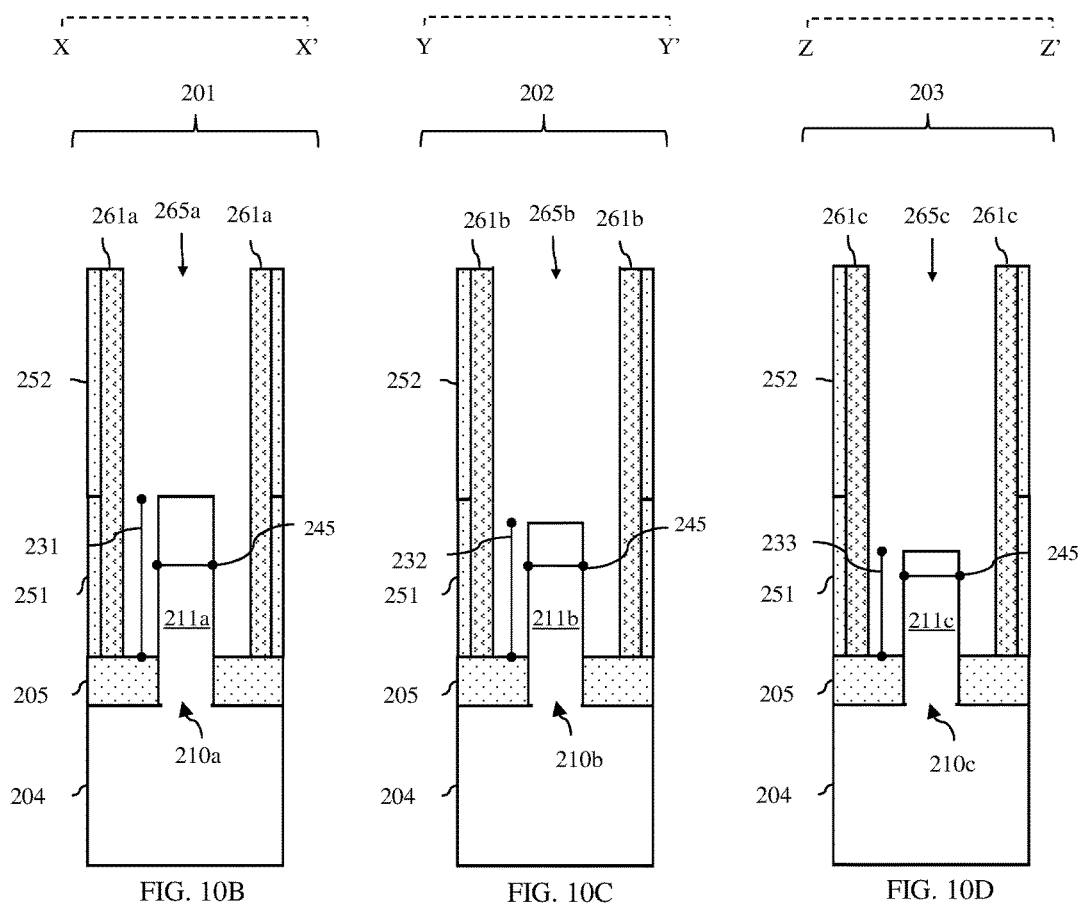
Figure 11A:
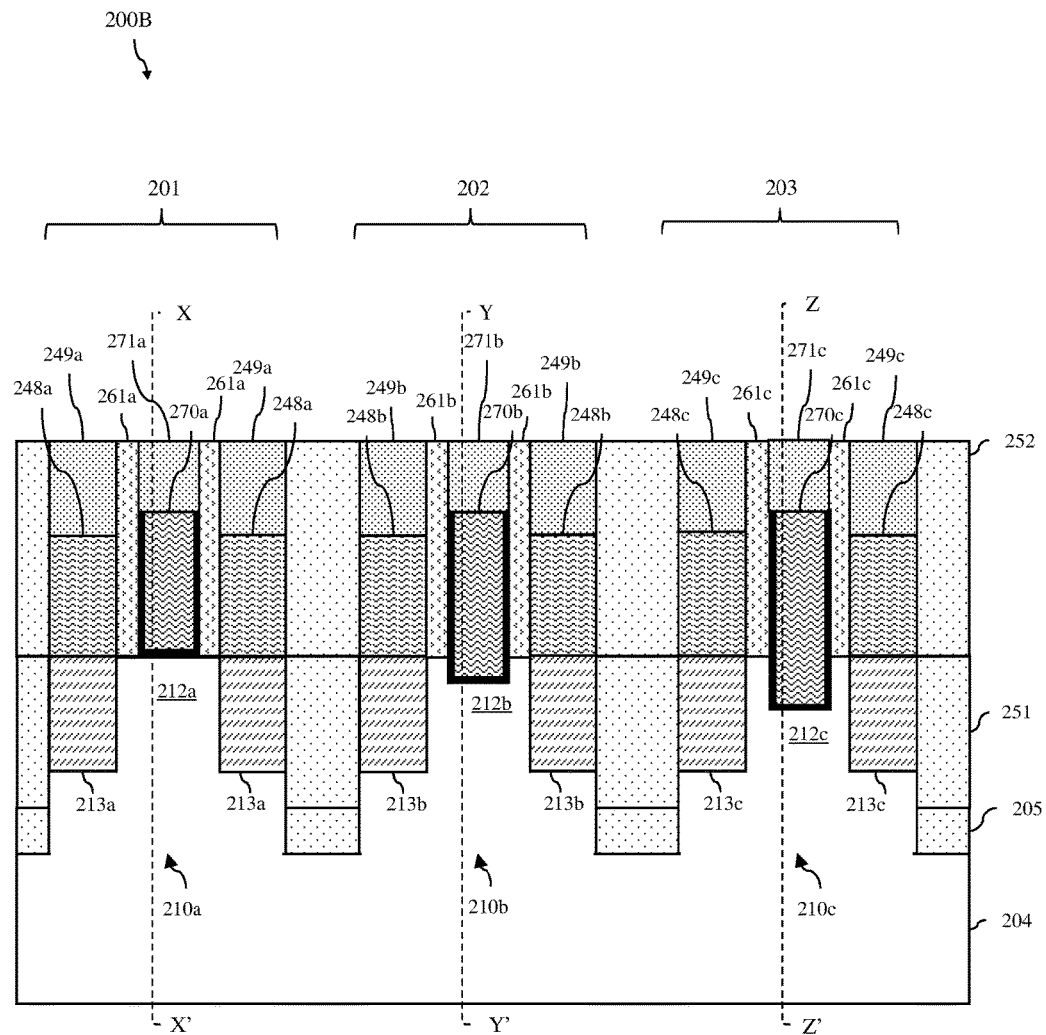
FIGS. 11A-11D are cross-section diagrams illustrating an IC structure formed using process flow B of the flow diagram of FIG. 1.
Figure 11B:
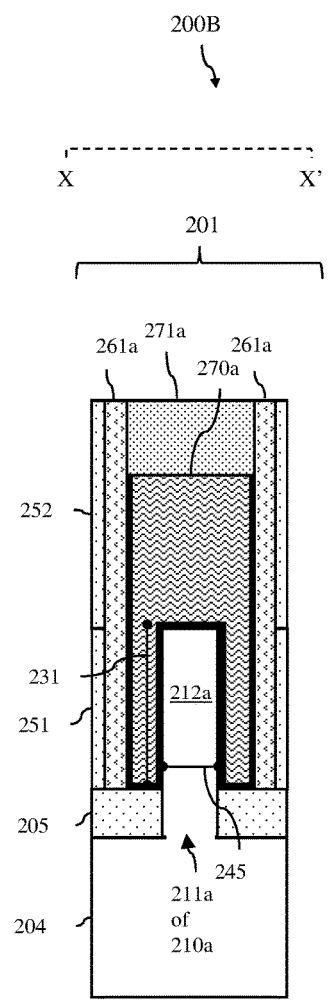
Figure 11C:
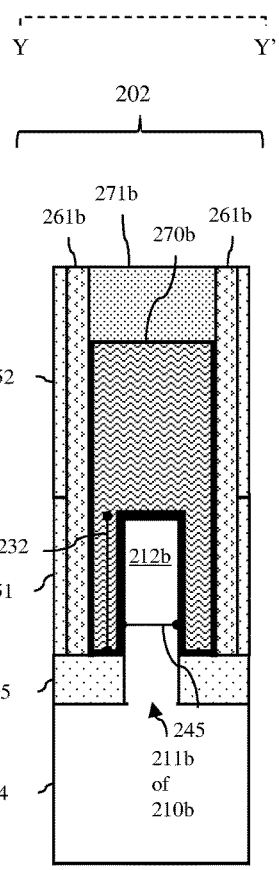
Figure 11D:
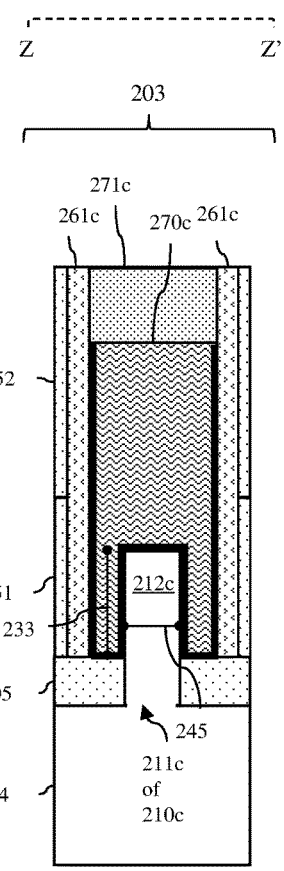
Figure 12A:
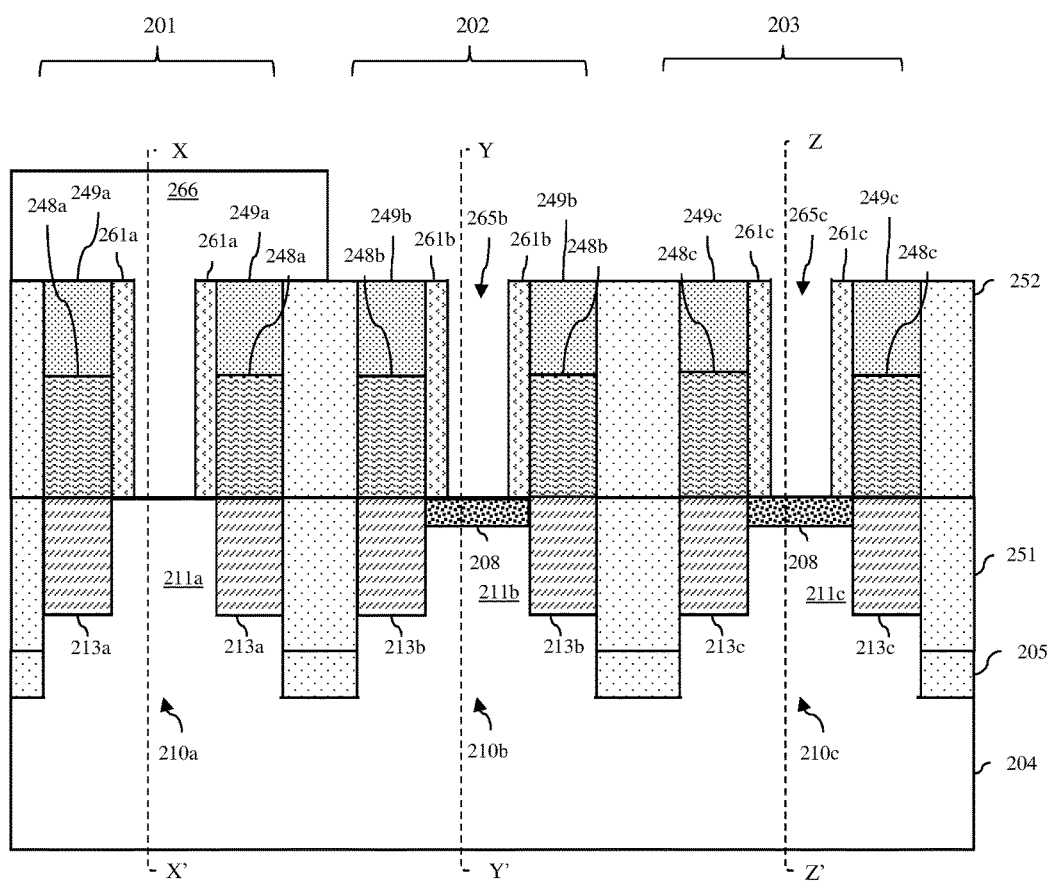
Figure 13A:
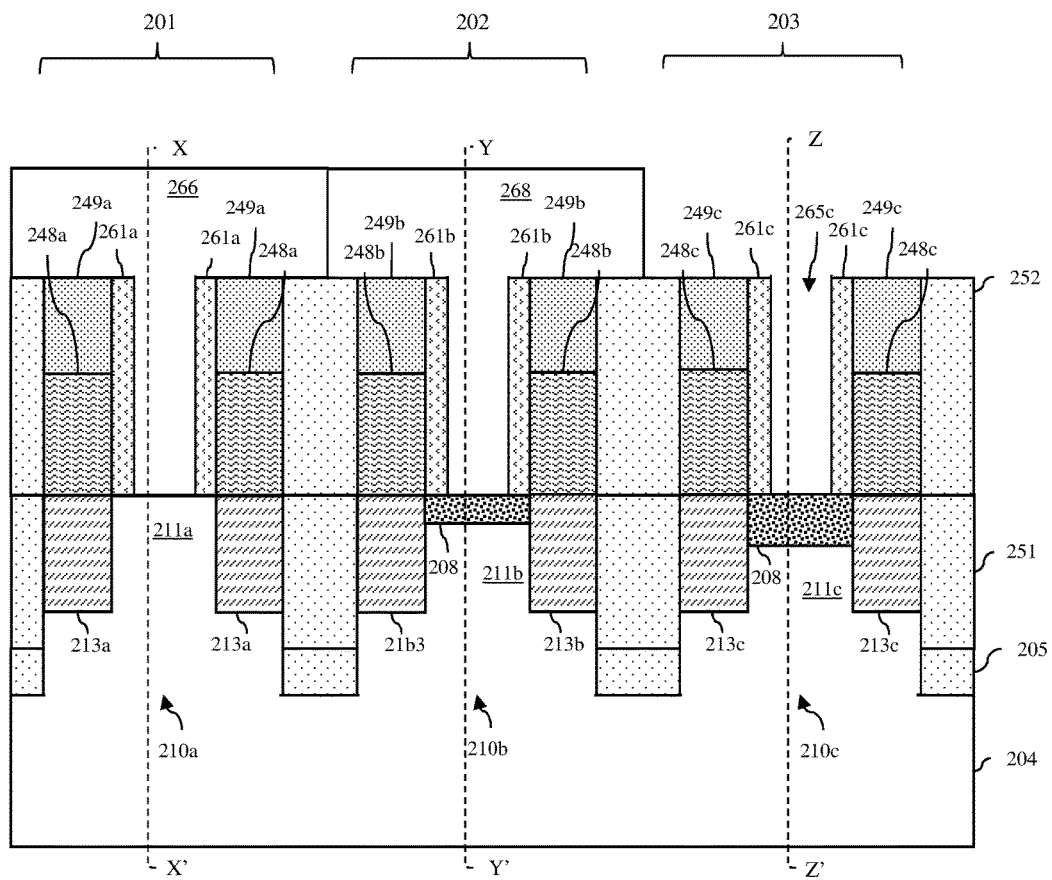
FIGS. 13A-13D are cross-section diagrams illustrating a partially completed IC structure formed using process flow C of the flow diagram of FIG. 1.
Figures 13B, 13C, 13D:
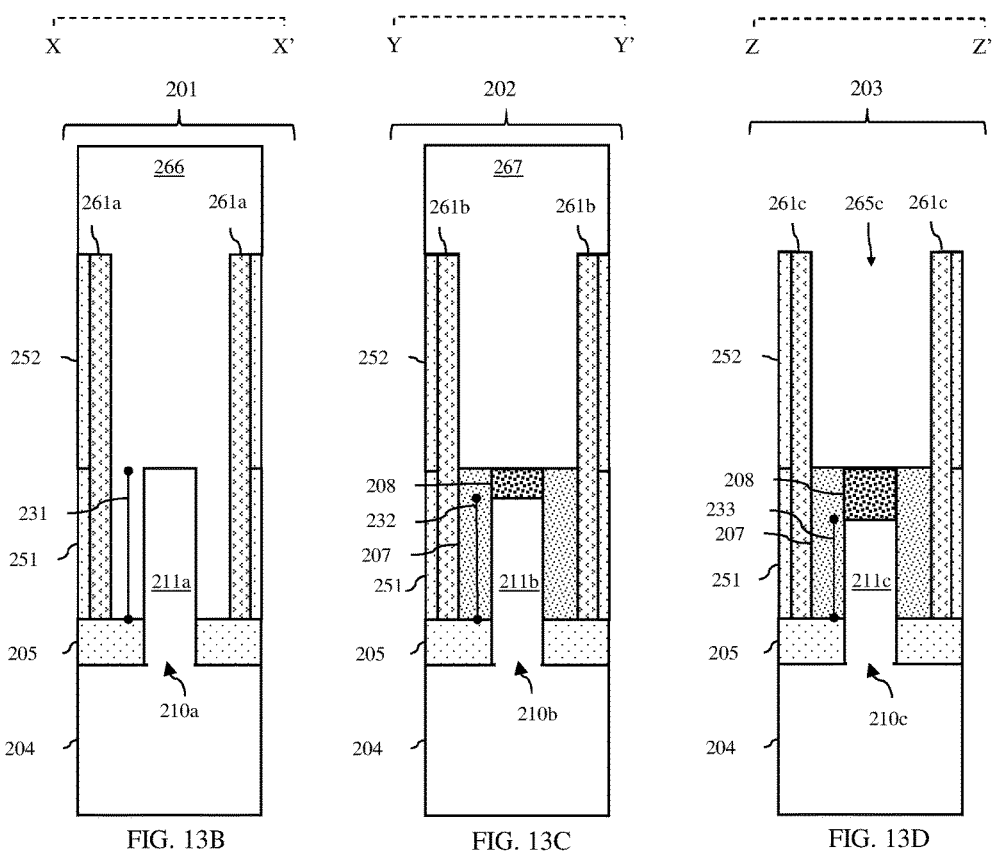
Figure 14A:
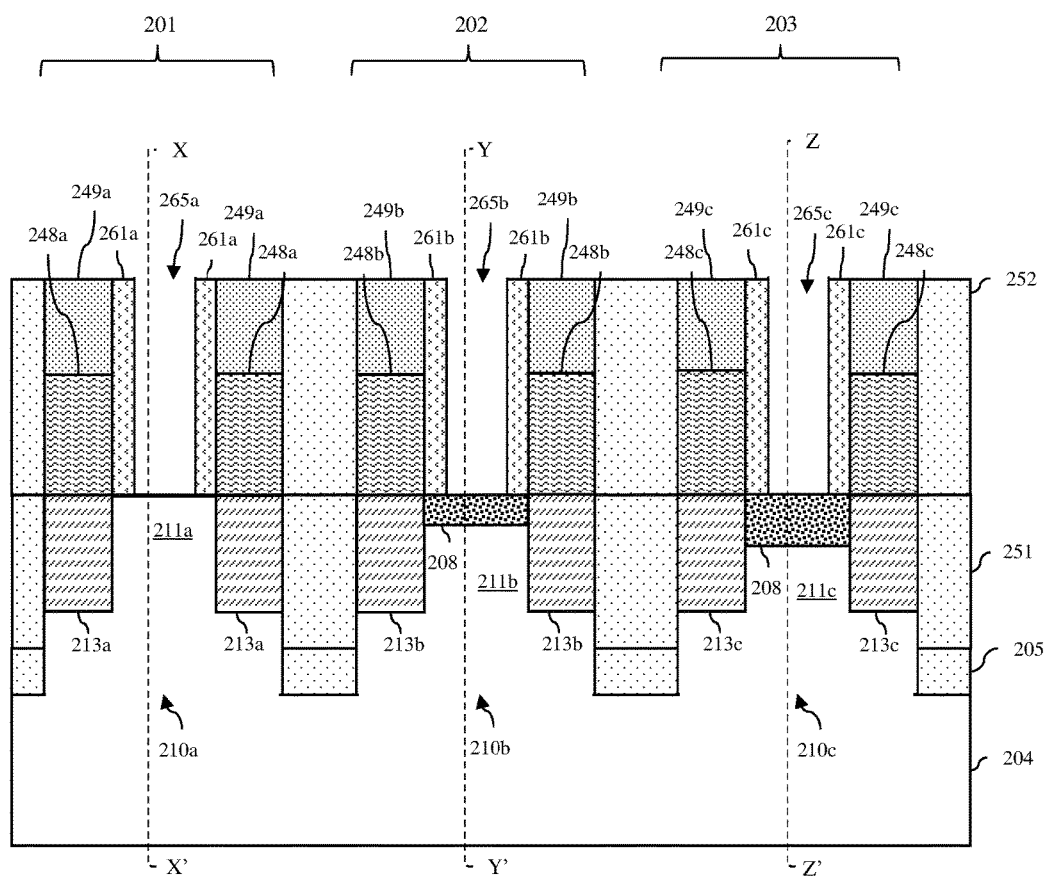
FIGS. 14A-14D are cross-section diagrams illustrating a partially completed IC structure formed using process flow C of the flow diagram of FIG. 1.
Figures 14B, 14C, 14D:
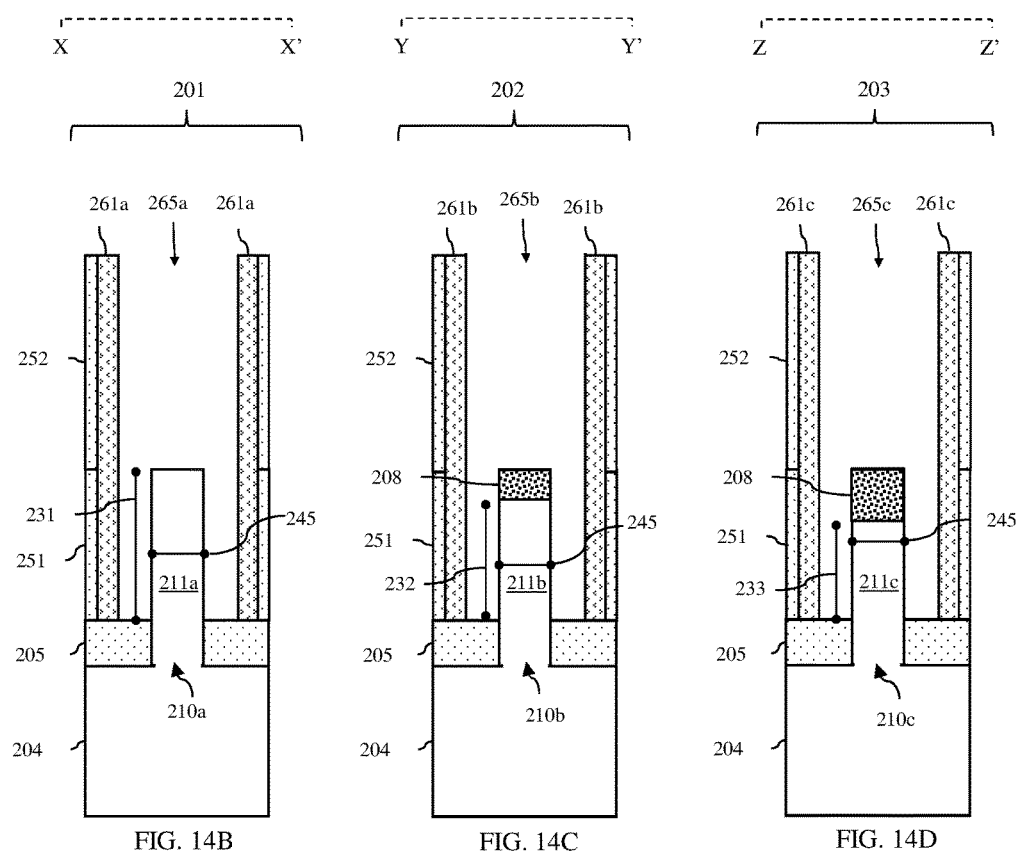
Figure 15A:
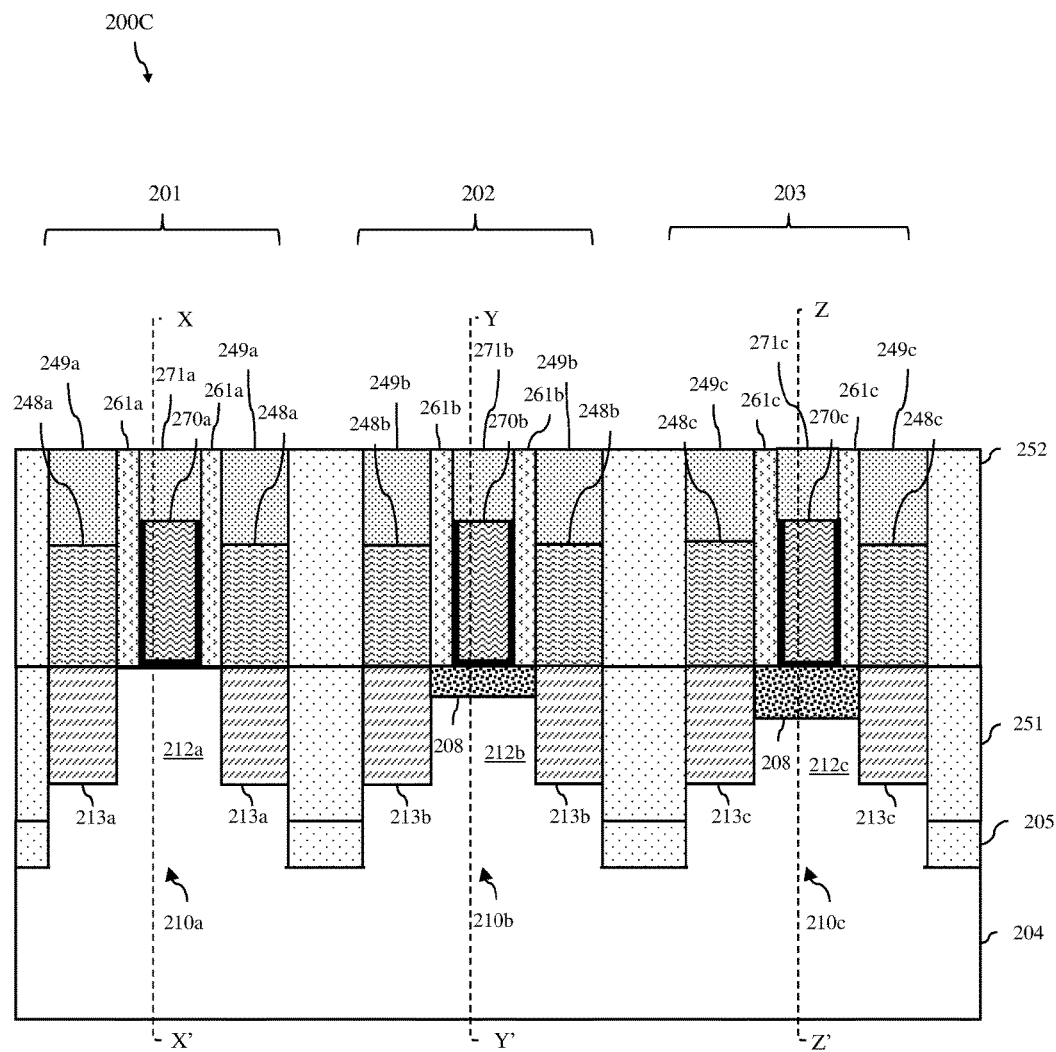

It should be noted that FIGS. 7A, 11A and 15A are cross-section diagrams that show the three IC structure embodiments 200A, 200B and 200C, respectively, wherein each of these IC structure embodiments includes transistors 201-203 having semiconductor fins 210a-210c and gates 270a-270c, which traverse and are perpendicular to the semiconductor fins 210a-210c, respectively. The orientation of the transistors 201-203 is such that the semiconductor fins 210a-210c are positioned in end-to-end alignment and the gates 270a-270c are parallel to each other. Thus, the cross-sections of FIGS. 7A, 11A and 15A, each show a vertical plane that cuts across through the semiconductor fins 210a-210c across the length of each of the transistors 201-203. FIGS. 7B, 11B and 15B are additional cross-section diagrams of the IC structure embodiments 200A, 200B and 200C, respectively, showing a different vertical plane that cuts across the transistor 201 at its channel region. FIGS. 7C, 11C and 15C are additional cross-section diagrams of the IC structure embodiments 200A, 200B and 200C, respectively, showing a different vertical plane that cuts across the transistor 202 at its channel region. FIGS. 7D, 11D and 15D are additional cross-section diagrams of the IC structure embodiments 200A, 200B and 200C, respectively, showing a different vertical plane that cuts across the transistor 203 at its channel region. It should be noted that the orientation of the transistors 201-203 relative to each other as shown within the figures (i.e., with the semiconductor fins 210a-210c in end-to-end alignment and the gates 270a-270c parallel) was chosen to best illustrate the similarities and differences between those transistors 201-203 in the IC structure embodiments 200A, 200B and 200C. However, it should be understood that this orientation as well as the lack of any connections (e.g., shared gates, shared source/drain regions, etc.) between the transistors is not intended to be limiting. Those skilled in the art will recognize that the orientation of the transistors 201-203 relative to each other as well as any connections (e.g., shared gates, shared source/drain regions, etc.) between them may vary depending upon the type of circuit and the layout of that circuit (e.g., depending upon the layout used for 6T-SRAM cells in an SRAM array).

In any case, the transistors 201-203 can all have the same type conductivity. That is, transistors 201-203 can all be N-type FETs or P-type FETs. Alternatively, at least some of the transistors 201-203 can have different type conductivities. In one exemplary embodiment, the first transistor 201 and the second transistor 202 can be N-type FETs and the third transistor 203 can be a P-type FET. More particularly, the first transistor 201 can be a N-type pull-down transistor of a static random access memory (SRAM) cell, the second transistor 202 can be an N-type pass-gate transistor of the SRAM cell, and the third transistor 203 can be a P-type pull-up transistor of the SRAM cell.

Given the different method embodiments described above, in each of the IC structure embodiments 200A-200C the sections of the semiconductor fins 210a-210c, which contain the channel regions 212a-212c of the transistors 201-203, all have the same width 245. Additionally, the dimensions (i.e., heights and widths) of the semiconductor fins 210a-210c at the source/drain regions 213a-213c, respectively, are also essentially identical. However, the first channel region 212a of the first transistor 201 has a first height 231 and the second channel region 212b of the second transistor 202 has a second height 232 that is less than the first height 231. Optionally, the third channel region 212c of the third transistor 203 further has a third height 233 that is less than the second height 232. Specifically, as discussed in detail above with regard to the method embodiments, the first transistor 201, the second transistor 202 and, optionally, the third transistor 203 can be formed with different features that ensure that the second height 232 of the second channel region 212b is less than the first height 231 of the first channel region 212a and, optionally, that the third height 233 of the third channel region 212c is less than the second height 232 of the second channel region 212b.

For example, at least some of the gates of some of the transistors can be above and immediately adjacent to an isolation region on the isolation layer. Specifically, as illustrated in the IC embodiment 200A shown in FIGS. 7A-7D, the first gate 270a of the first transistor 201 can be within a first gate opening adjacent to the first top surface and first opposing sidewalls of a first section 211a of the first semiconductor fin 210a. Furthermore, within the first gate opening, this first gate 270a can be above and immediately adjacent to the top surface of the isolation layer 205 on either side of the first section 211a of the first semiconductor fin 210a. The second gate 270b of the second transistor 202 can be within a second gate opening adjacent to the second top surface and second opposing sidewalls of a second section 211b of the second semiconductor fin 210b. However, instead of being above and immediately adjacent to the top surface of the isolation layer 205, the second gate 270b can be above and immediately adjacent to the top surface of an isolation region 206, which is above the isolation layer 205 on either side of the second section 211b of the second semiconductor fin 210b. The third gate 270c of the third transistor 203 can be within a third gate opening adjacent to the third top surface and third opposing sidewalls of a third section 211c of the third semiconductor fin 210c. However, instead of being above and immediately adjacent to the top surface of the isolation layer 205, the third gate 270c can be above and immediately adjacent to the top surface of an isolation region 206, which is above the isolation layer 205 on either side of the third section 211c of the third semiconductor fin 210c, and optionally the isolation region 206 within the third gate opening can be taller than the isolation region within the second gate opening (i.e., the isolation regions in the different gate openings can have different heights).

Due to the presence of the isolation region 206 in the second gate opening and further due to the fact that the top surfaces of the sections 211a-211c of the semiconductor fins 210a-210c remain essentially co-planar, the gate-to-semiconductor interface length at each sidewall of the first semiconductor fin 210a is greater than the gate-to-semiconductor interface length at each sidewall of the second semiconductor fin 210b. Furthermore, when the isolation region 206 within the third gate opening 265c is taller than the isolation region 206 within the second gate opening 265b, the gate-to-semiconductor interface length at each sidewall of the second semiconductor fin 210b is greater than the gate-to-semiconductor interface length at the each sidewall of the third semiconductor fin 210c. Thus, in the IC structure embodiment 200A shown in FIGS. 7A-7D, the first channel region 212a of the first transistor 201 has a first height, which is equal to the distance 231 between the first top surface of the first section 211a of the first semiconductor fin 210a and the top surface of the isolation layer 205 on either side of that first section 211a of the first semiconductor fin 210a. The second channel region 212b of the second transistor 202 has a second height, which is less than the first height and which is equal to the distance 232 between the second top surface of the second section 211b of the second semiconductor fin 210b and the top surface of the isolation region 206 on either side of that second section 211b of the second semiconductor fin 210b. The third channel region 212c of the third transistor 203 has a third height, which is less than the first height and which is equal to the distance 233 between the third top surface of the third section 211c of the third semiconductor fin 210c and the top surface of the isolation region 206 on either side of that third section 211c of the third semiconductor fin 210c. Furthermore, if the isolation region 206 on either side of the third section 211c of the third semiconductor fin 210c is taller than the isolation region 206 on either side of the second section 211b of the second semiconductor fin 210b, the third height will also be less than the second height, as illustrated.

Alternatively, the top surfaces of at least some of the sections 211a-211c of the semiconductor fins 210a-210c can be at different levels. For example, as illustrated in the IC structure embodiment 200B shown in FIGS. 11A-11D, the first gate 270a of the first transistor 201 can be within a first gate opening adjacent to the first top surface and first opposing sidewalls of a first section 211a of the first semiconductor fin 210a. Furthermore, within the first gate opening, this first gate 270a can be above and immediately adjacent to the top surface of the isolation layer 205 on either side of the first section 211a of the first semiconductor fin 210a. Similarly, the second gate 270b of the second transistor 202 can be within a second gate opening adjacent to the second top surface and second opposing sidewalls of a second section 211b of the second semiconductor fin 210b. The second gate 270b can further be above and immediately adjacent to the top surface of the isolation layer 205 on either side of the second section 211b of the second semiconductor fin 210b. The third gate 270c of the third transistor 203 can be within a third gate opening adjacent to the third top surface and third opposing sidewalls of a third section 211c of the third semiconductor fin 210c. The third gate 270c can also be above and immediately adjacent to the top surface of the isolation layer 205 on either side of the third section 211c of the third semiconductor fin 210c. However, in this case, the first top surface of the first section 211a of the first semiconductor fin 210a can be above the level of the second top surface of the second section 211b of the second semiconductor fin 210b and, optionally, the second top surface of the second section 211b of the second semiconductor fin 210b can be above the level of the third top surface of the third section 211c of the third semiconductor fin 210c.

Due to the fact that the first top surface of the first section 211a of the first semiconductor fin 210a is at a higher level than the second top surface of the second section 211b of the second semiconductor fin 210b, the gate-to-semiconductor interface length at each sidewall of the first semiconductor fin 210a is greater than the gate-to-semiconductor interface length at each sidewall of the second semiconductor fin 210b. Furthermore, when the second top surface of the second section 211b of the second semiconductor fin 210b is at a higher level than the third top surface of the third section 211c of the third semiconductor fin 210c, the gate-to-semiconductor interface length at each sidewall of the second semiconductor fin 210b is greater than the gate-to-semiconductor interface length at each sidewall of the third semiconductor fin 210c. Thus, in the resulting IC structure embodiment 200B shown in FIGS. 11A-11D, the first channel region 212a of the first transistor 201 has a first height, which is equal to the distance 231 that separates the first top surface of the first section 211a of the first semiconductor fin 210a from the top surface of the isolation layer 205 on either side and the second channel region 212b of the second transistor 202 has a second height, which is less than the first height and which is equal to the distance 232 that separates the second top surface of the second section 211b of the second semiconductor fin 210b from the top surface of the isolation layer 205. Optionally, the third channel region 212c of the third transistor has a third height 233, which is less than the second height and which is equal to the distance 233 that separates the third top surface of the third section 211c of the third semiconductor fin 210c from the top surface of the isolation layer 205.

Alternatively, the tops of at least some of the sections 211a-211c of the semiconductor fins 210a-210c can contain isolation regions 208. For example, as illustrated in the IC structure embodiment 200C of FIGS. 15A-15D, the first gate 270a of the first transistor 201 can be within a first gate opening adjacent to the first top surface and first opposing sidewalls of a first section 211a of the first semiconductor fin 210a. Furthermore, within the first gate opening, this first gate 270a can be above and immediately adjacent to the top surface of the isolation layer 205 on either side of the first section 211a of the first semiconductor fin 210a. Similarly, the second gate 270b of the second transistor 202 can be within a second gate opening adjacent to the second top surface and second opposing sidewalls of a second section 211b of the second semiconductor fin 210b. The second gate 270b can further be above and immediately adjacent to the top surface of the isolation layer 205 on either side of the second section 211b of the second semiconductor fin 210b. The third gate 270c of the third transistor 203 can be within a third gate opening adjacent to the third top surface and third opposing sidewalls of a third section 211c of the third semiconductor fin 210c. The third gate 270c can also be above and immediately adjacent to the top surface of the isolation layer 205 on either side of the third section 211c of the third semiconductor fin 210c. However, in this IC embodiment 200C, isolation regions 208 can be within the tops of the second and third sections 211b-211c of the second and third semiconductor fins 210b-210c, respectively, and such an isolation region can effectively reduce the gate-to-semiconductor interface length on each sidewall of a semiconductor fin.

More specifically, the isolation regions 208 can be oxide regions (i.e., regions of the fins that have been oxidized). Alternatively, the isolation regions 208 can be dopant implant regions (i.e., regions of the fins that have been subjected to a dopant implant process). It should be understood that if the conductivity types of the second transistor 202 and the third transistor 203 are different, then the conductivity types of such dopant implantation regions will be different in order to achieve the desired isolation. For example, for an N-type transistor (e.g., if the second transistor 202 is an N-type pass-gate transistor of an SRAM cell), the dopant implantation region should have P-type conductivity at a relatively high conductivity level (i.e., should be a P+ region). For a P-type transistor (e.g., if the third transistor 203 is a P-type pull-up transistor of an SRAM cell), the dopant implantation region should have N-type conductivity at a relatively high conductivity level (i.e., should be an N+ region). Optionally, the isolation regions 208 in the tops of the second and third sections 211b-211c of the second and third semiconductor fins 210b-210c can have different depths. For example, the bottom of the isolation region 208 within the third section 211c of the third semiconductor fin 210c can be at a lower level than the bottom of the isolation region 208 within the second section 211b of the second semiconductor fin 210b.

In this IC embodiment 200C, the actual top surfaces of the sections 211a-211c of the semiconductor fins 210a-210c are essentially co-planar. However, due to the presence of the isolation regions 208, the effective top surfaces of the sections 211b-211c are lower and, thus, the gate-to-semiconductor interface lengths at the sidewalls of these sections are smaller. Specifically, the first top surface of the first section 211a of the first semiconductor fin 210a is at a higher level than the effective top surface of the second section 211b of the second semiconductor fin 210b. Thus, the gate-to-semiconductor interface length at each sidewall of the first semiconductor fin 210a is greater than the gate-to-semiconductor interface length at each sidewall of the second semiconductor fin 210b. Furthermore, when the isolation region 208 in the top of the third section 211c of the third semiconductor fin 210c extends deeper than the isolation region 208 in the top of second section 211c, the gate-to-semiconductor interface length at each sidewall of the second semiconductor fin 210b will be greater than the gate-to-semiconductor interface length at each sidewall of the third semiconductor fin 210c. Thus, in the resulting IC structure embodiment 200C of FIGS. 15A-15D, the first channel region 212a of the first transistor 201 has a first height, which is equal to the distance 231 that separates the first top surface of the first section 211a of the first semiconductor fin 210a from the top surface of the isolation layer 205 on either side of that first section 211a. The second channel region 212b of the second transistor 202 has a second height, which is less than the first height and which is equal to the distance 232 that separates the bottom of the isolation region 208 within the second section 211b of the second semiconductor fin 210b from the top surface of the isolation layer 205. Optionally, the third channel region 212c of the third transistor 203 has a third height, which is less than the second height and which is equal to the distance 233 that separates the bottom of the isolation region 208 within the third section 211c of the third semiconductor fin 210c from the top surface of the isolation layer 205.

In the above-described IC structure embodiments 200A-200C, the transistors 201-203 have different channel region heights 231-233 and, thereby different effective channel widths and different drive currents. Thus, in the embodiment where the first transistor 201 is an N-type pull-down transistor of an SRAM and the second transistor 202 is an N-type pass-gate transistor of the SRAM, the channel region height 232 of the N-type pass-gate transistor can be reduced relative to the channel region height 231 of the N-type pull-down resistor to balance out the conflicting requirements for Ion_PG in the gamma and beta ratios in the SRAM cell structure and, thereby improve soft yield (i.e., to minimize soft errors or memory write or read fails). Furthermore, if the third transistor 203 is a P-type pull-up transistor of the SRAM, the channel region height 233 of the P-type pull-up transistor can be reduced relative to the channel region height 232 of the N-type pass-gate transistor to further improve performance. Furthermore, the different channel regions heights are achieved without causing other transistor-to-transistor structural variations (e.g., different fin widths, etc.) and, thus, within the IC structure embodiment 200A-200C unintended performance variations between the transistors are avoided or at least minimized.

It should further be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
  removing a first sacrificial gate to form a first gate opening and a second sacrificial gate to form a second gate opening, wherein an exposed first section of a first semiconductor fin in the first gate opening is between first source/drain regions of a first transistor and has a first top surface and first opposing sidewalls and an exposed second section of a second semiconductor fin in the second gate opening is between second source/drain regions of a second transistor and has a second top surface and second opposing sidewalls;
  forming a mask over the first gate opening;
  depositing a protective sacrificial material so as to fill the second gate opening;
  recessing the protective sacrificial material in the second gate opening to expose the second top surface;
  processing the second top surface;
  after the processing, selectively removing the protective sacrificial material; and
  forming a first gate in the first gate opening and a second gate in the second gate opening, the first gate being adjacent to the first top surface and the first opposing sidewalls and defining a first channel region within the first semiconductor fin and the second gate being adjacent to the second top surface and second opposing sidewalls and defining a second channel region in the second semiconductor fin, wherein, due to the processing of the second top surface, a first height of the first channel region is greater than a second height of the second channel region.

2. The method of claim 1, wherein the first transistor is a pull-down transistor of a static random access memory cell and the second transistor is a pass-gate transistor of the static random access memory cell.

3. The method of claim 1, the protective sacrificial material comprises amorphous carbon and ensures that, after the processing of the second top surface, the first semiconductor fin and the second semiconductor fin have a same width at the first channel region and at the second channel region, respectively.

4. The method of claim 1, the processing of the second top surface comprising forming an isolation region in the second semiconductor fin at the second top surface by one of performing an oxidation process and performing a dopant implantation process.

* * * * *